US010168444B2

(12) United States Patent
Jachmann et al.

(10) Patent No.: US 10,168,444 B2
(45) Date of Patent: Jan. 1, 2019

(54) DATA PROCESSING WITH MAGNETIC RESONANCE TOOL

(71) Applicant: Halliburton Energy Services, Inc., Houston, TX (US)

(72) Inventors: Rebecca Corina Jachmann, Kingwood, TX (US); Jie Yang, Paoli, PA (US)

(73) Assignee: Halliburton Energy Services, Inc., Houston, TX (US)

( * ) Notice: Subject to any disclaimer, the term of this patent is extended or adjusted under 35 U.S.C. 154(b) by 558 days.

(21) Appl. No.: 14/769,963

(22) PCT Filed: Mar. 26, 2014

(86) PCT No.: PCT/US2014/031891
§ 371 (c)(1),
(2) Date: Aug. 24, 2015

(87) PCT Pub. No.: WO2014/160794
PCT Pub. Date: Oct. 2, 2014

(65) Prior Publication Data
US 2016/0018555 A1 Jan. 21, 2016

Related U.S. Application Data

(60) Provisional application No. 61/806,279, filed on Mar. 28, 2013.

(51) Int. Cl.
*G01V 3/00* (2006.01)
*G01V 3/32* (2006.01)
(Continued)

(52) U.S. Cl.
CPC ............. *G01V 3/32* (2013.01); *G01R 33/448* (2013.01); *G01V 3/38* (2013.01)

(58) Field of Classification Search
CPC .......... G01V 3/32; G01V 3/38; G01N 24/081; G01R 33/448; G01R 33/3808
(Continued)

(56) References Cited

U.S. PATENT DOCUMENTS 5,105,152 A * 4/1992 Pauly ................... G01R 33/446
324/307
5,517,115 A  5/1996 Prammer
(Continued)

FOREIGN PATENT DOCUMENTS

WO   WO-2014160794 A1   10/2014

OTHER PUBLICATIONS

"Australian Application Serial No. 2014241263, Subsequent Examiners Report dated Oct. 6, 2016", 4 pgs.
(Continued)

*Primary Examiner* — David M Gray
*Assistant Examiner* — Frederick Wenderoth
(74) *Attorney, Agent, or Firm* — Gilliam IP PLLC

(57) ABSTRACT

Various embodiments include apparatus and methods to acquire echo signals associated with operation of a nuclear magnetic resonance logging tool to evaluate a formation and process the echo signals taking into account motion of the nuclear magnetic resonance logging tool. Coefficients may 5 be generated that are correlated to porosity of the formation. Additional apparatus, systems, and methods are disclosed.

32 Claims, 26 Drawing Sheets

(51) Int. Cl.
 *G01R 33/44* (2006.01)
 *G01V 3/38* (2006.01)
(58) Field of Classification Search
 USPC .......................................................... 324/303
 See application file for complete search history.

(56) References Cited

U.S. PATENT DOCUMENTS

| | | | | |
|---|---|---|---|---|
| 5,994,901 | A * | 11/1999 | McIntyre | G01N 24/081 324/303 |
| 6,255,818 | B1 | 7/2001 | Heaton et al. | |
| 2002/0125885 | A1 | 9/2002 | Reiderman et al. | |
| 2003/0132749 | A1 | 7/2003 | Speier et al. | |
| 2004/0252230 | A1* | 12/2004 | Winder | H04N 5/145 348/402.1 |
| 2005/0088176 | A1 | 4/2005 | Kruspe et al. | |
| 2005/0104587 | A1 | 5/2005 | Akkurt | |
| 2007/0222443 | A1 | 9/2007 | Blanz | |
| 2011/0156705 | A1 | 6/2011 | Chan et al. | |
| 2011/0191080 | A1* | 8/2011 | Klie | G06F 17/50 703/10 |
| 2012/0025820 | A1* | 2/2012 | Cao Minh | G01V 3/32 324/303 |
| 2012/0224455 | A1* | 9/2012 | Dorovsky | G01V 11/00 367/35 |

OTHER PUBLICATIONS

"Mexican Application Serial No. MX/a/2015/010632, Office Action dated Sep. 12, 2016", 3 pages (6 total with English translation).

"Australian Application Serial No. 2014241263, First Examiner Report dated Oct. 8, 2015", 3 pgs.

"Australian Application Serial No. 2014241263, First Statement of Proposed Amendments filed Oct. 3, 2016 in repsonse to First Examiner Report dated Oct. 8, 2015", 25 pgs.

Dunn, K J, et al., "Nuclear Magnetic Resonance Petrophysical and Logging Applications", *In: Handbook of Geophysical Exploration*: vol. 32—Seismic Exploration, Elsevier Science Ltd., (2002), 156-182.

Hoult, D. I., "The Principle of Reciprocity in Signal Strength Calculations—A Mathematical Guide", *Concepts in Magnetic Resonance*, 12(4), (2000), 173-187.

Tannus, A., et al., "Adiabatic Pulses", *NMR in Biomedicine*, 10, (1997), 423-434.

"International Application Serial No. PCT/US2014/031891, International Search Report dated Aug. 18, 2014", 5 pgs.

"International Application Serial No. PCT/US2014/031891, Written Opinion dated Aug. 18, 2014", 8 pgs.

"Australian Patent Application No. 2016238954, First Examination Report dated Sep. 1, 2017", 4 pages.

* cited by examiner

Longitudinal recovery, T1
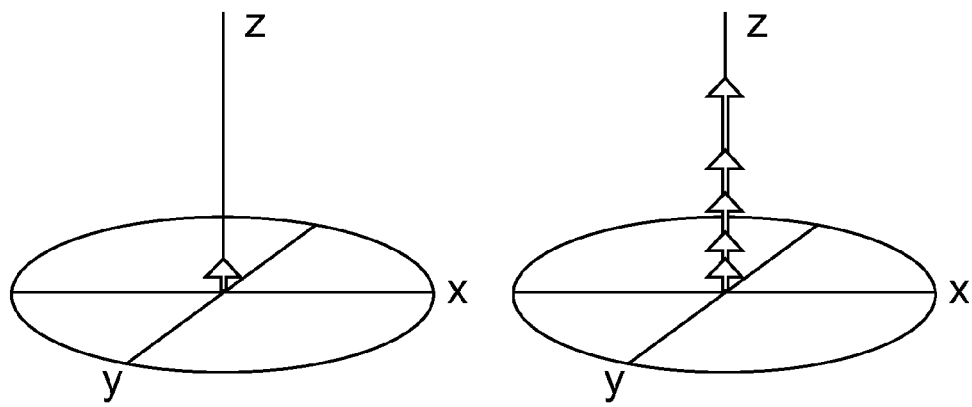
Transverse relaxation, T2
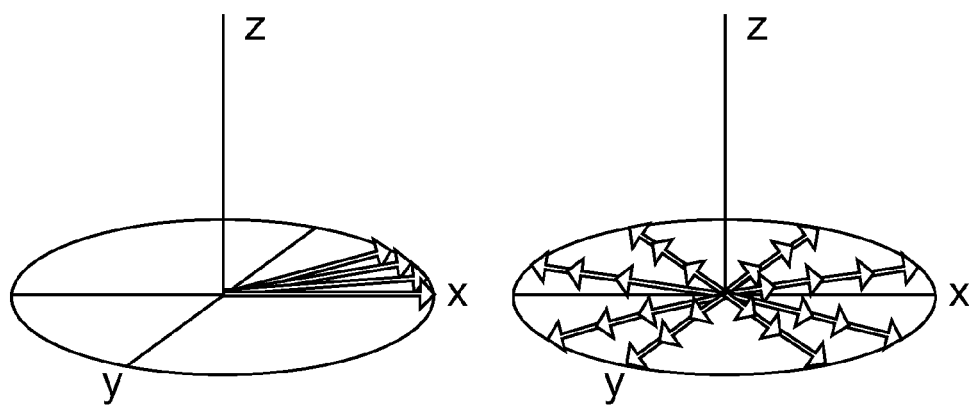
Fig. 5

DATA PROCESSING WITH MAGNETIC RESONANCE TOOL

CLAIM OF PRIORITY

This application is a U.S. National Stage Filing under 35 U.S.C. 371 from International Application No. PCT/US2014/031891, filed on 26 Mar. 2014, and published as WO 2014/160794 A1 on 2 Oct. 2014, which claims the benefit of U.S. Provisional Application Ser. No. 61/806,279, filed on Mar. 28, 2013 which applications are incorporated by reference herein in their entirety.

TECHNICAL FIELD

The present invention relates generally to apparatus and methods related to nuclear magnetic resonance.

BACKGROUND

Nuclear magnetic resonance (NMR) is used as a tool in a number of different technology areas to investigate different types of mediums. NMR can occur when the medium is subjected to a static magnetic field, $B_0$, and to an oscillating magnetic field, $B_1$. When subjected to an applied static magnetic field, polarization of nuclear magnetic spins of the medium occurs based on spin number of the medium and magnetic field strength. Applying an electromagnetic field to the medium in the static magnetic field can perturb the polarization established by the static magnetic field. In optimal measurements, the static magnetic field and the perturbing field are perpendicular to each other. Collected responses received from the medium related to the total magnetization of nuclear spins in the medium, in response to these applied fields, can be used to investigate properties of the medium, and may provide imaging of the medium. It is noted that magnetization is proportional to polarization.

Nuclear magnetic resonance measurements are created by the oscillation of excited nuclear magnetic spins in the transverse plane, that is, the direction perpendicular to the magnetic field. This oscillation eventually dies out and the equilibrium magnetization returns. The return process is referred to as longitudinal relaxation. The time constant, $T_1$, for nuclei to return to their equilibrium magnetization, $M_o$, is called the longitudinal relaxation time or the spin lattice relaxation time. The magnetization dephasing, that is losing coherence, along the transverse plane is given by the time constant $T_2$ and is called the spin-spin relaxation time. The loss of phase coherence can be caused by several factors including interactions between spins, electrons, or magnetic gradients.

A widely used NMR measurement technique, designed by Carr, Purcell, Meiboom, and Gill and, hence, referred to as CPMG, uses a sequence of radio frequency pulses to produce spin echoes and counteract dephasing of the magnetization in the medium investigated. In the CPMG sequence, an initial pulse, commonly a 90° pulse, can be applied to tip the polarization into a plane perpendicular to the static magnetic field. To counter dephasing due to magnetic inhomogeneities, another pulse, a recovery pulse, commonly a 180° or other angle tipping pulse, is applied to return to phase, which produces a signal called an echo from the medium. Yet, after each return to phase, dephasing begins and another recovery pulse is applied for rephasing. Rephasing or refocusing is repeated many times in the CPMG sequence, followed by measuring each echo. The echo magnitude decreases with time due to a number of irreversible relaxation mechanisms. The CPMG sequence can have any number of echoes, where the time between each echo can be relatively short, for example, of the order of 0.5 ms or less or as long as 12 ms is used.

NMR logging tools have long proven their value to formation evaluation. Petrophysical information can be derived from NMR measurements, such as, but not limited to petrophysical properties of fluid containing porous media. Various properties that can be measured using an NMR logging tool include pore size, porosity, surface-to-volume ratio, formation permeability, and capillary pressure. These properties are determined from inversion of data. Recently, new drilling tools have added low-gradient magnet configurations to help reduce the effects of axis motion. The primary challenge associated with using low-gradient tools is the requirement of one preferred sensitive volume to be tracked over temperature. The secondary challenge is that the sensitive volume associated with low-gradient tools provides a vertically short sensitive volume. As a result, the tools are more sensitive to vertical motion, and thus to rate of penetration (ROP) or pulling speed, opposed to high-gradient configuration tools, particularly for $T_1$ logging. Not only is porosity affected, but the $T_1$ spectrum can also be distorted. Having a more reliable inversion may provide more precision in the evaluation of NMR data to generate correct porosity, $T_2$ spectra, $T_1$ spectra, diffusion spectra, and other parameters.

BRIEF DESCRIPTION OF THE DRAWINGS

FIG. 5 is a representation of two characteristics of magnetization: longitudinal recovery and transverse relaxation.

DETAILED DESCRIPTION

The following detailed description refers to the accompanying drawings that show, by way of illustration and not limitation, various embodiments in which the invention may be practiced. These embodiments are described in sufficient detail to enable those skilled in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, the accuracy and precision of NMR inversion for downhole logging data is increased. One or more processors and memory systems can be used to execute instructions to realize accuracy and precision of NMR inversion for downhole logging data. Data can be provided by NMR tools.

Figure 1:
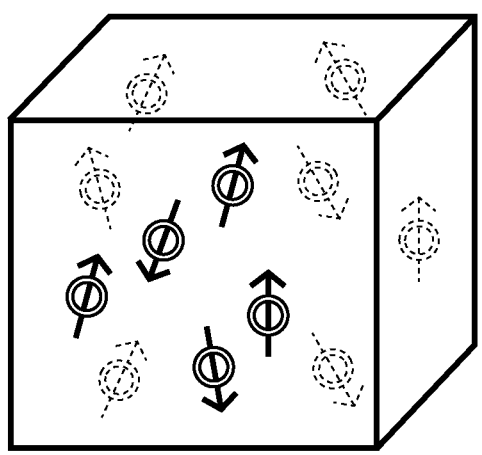
FIG. 1 is a representation of a sample with non-zero nuclear magnetic spin of a nuclear magnetic resonance experiment.
Figure 2:
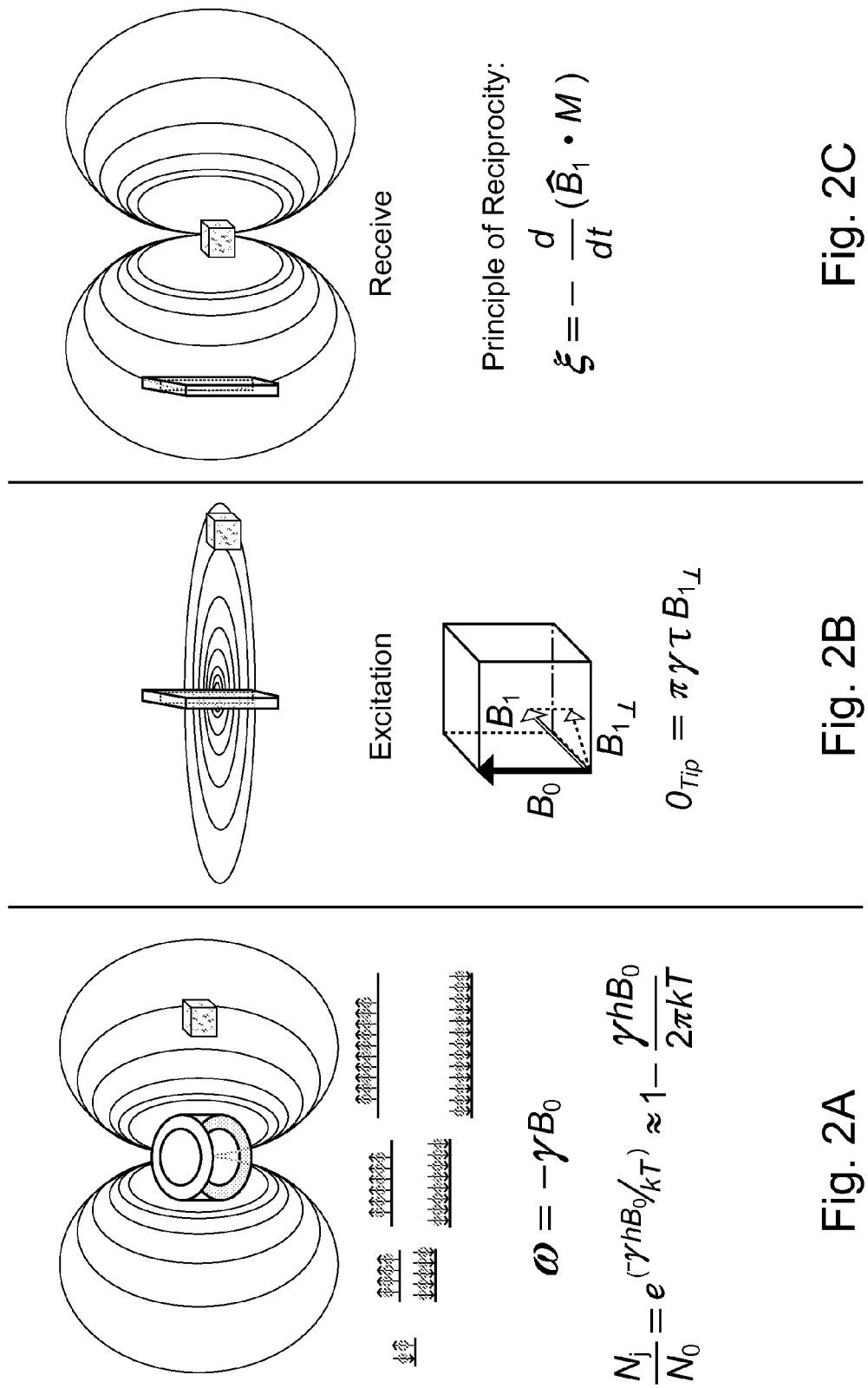
FIG. 2A is a representation of magnetic spins aligning with a magnetic field according to the Boltzmann distribution when placed in the magnetic field.
FIG. 2B is a representation of a second time varying magnetic field applied as an excitation.
FIG. 2C is a representation of a signal received from the excited nuclear spins according to the principle of reciprocity.

A NMR experiment can be conducted on a sample with non-zero nuclear magnetic spin represented in FIG. 1. When placed in a magnetic field the magnetic spins tend to align more towards that magnetic field than not, according to the Boltzmann distribution as shown in FIG. 2A. This magnetic field traditionally is referred to as the "main magnetic field" or the "static field" as it is usually independent of time and is given the symbol $B_0$. The bulk effect of nuclear magnetic spin alignment is called the magnetization and given the symbol M. It can be thought of as mini localized magnetic fields.

A second time varying magnetic field is also applied as shown in FIG. 2B. That field is designated as $B_1$ (also called the "radio frequency field") and is turned on and off at different increments, known as a pulse. This magnetization excitation results in a tip angle, $\theta_{Tip}$. The $B_1$ magnetic field in the majority of NMR experiments is created by a coil, called an antenna, and is powered by a "transmitter."

Figure 3:
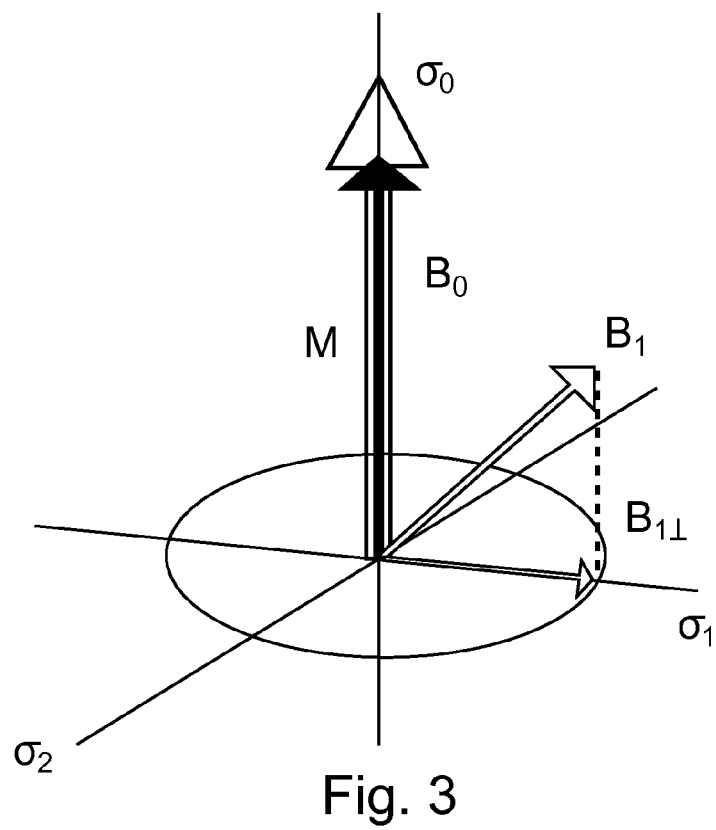
FIG. 3 is a representation of the interactions of a static magnetic field and a radio frequency field magnetic field through nuclear spin in a nuclear magnetic resonance experiment.
Figure 4:
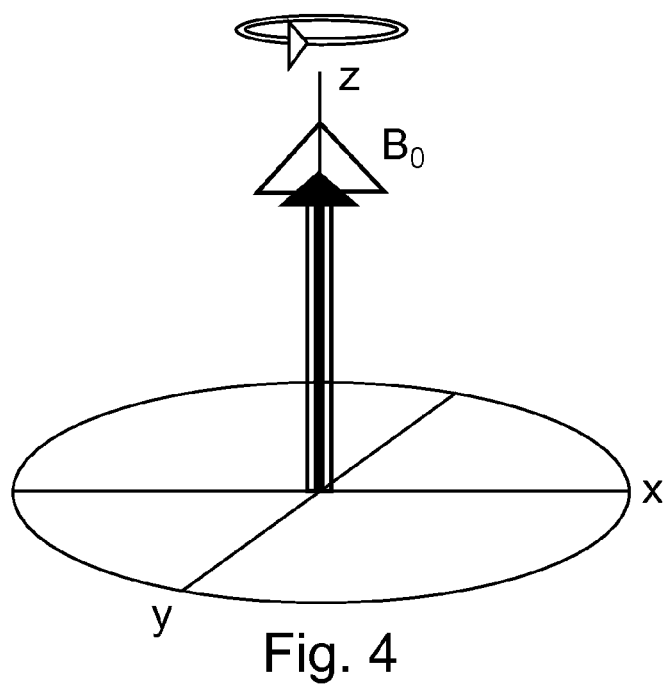
FIG. 4 is a representation of a system in equilibrium with the magnetization aligned with a static magnetic field and rotating on its axis around the direction of the static magnetic field.

The NMR experiment depends on the nuclear spins (the object of interest) interaction with the $B_1$ and $B_0$ as shown in FIG. 3. The $B_0$ direction at any point dominates the interaction when $B_0 \gg B_1$, which is the case for downhole tools. This means only portions perpendicular to the $B_0$ will matter for B1. The last part of the NMR experiment is to receive a signal from the excited nuclear spins. This happens according to the principle of reciprocity as shown in FIG. 2C, as the nuclear spins act as mini transmitting coils. The system in equilibrium will look something like that of FIG. 4. The local magnetization is aligned with the local $B_0$ magnetic field and rotates on its axis around the $B_0$'s direction.

The received data, in contemporary downhole experiments, reveals two characteristics of the magnetization: longitudinal recovery ($T_1$) and transverse relaxation ($T_2$) shown in FIG. 5. Since the magnetic fields in logging tools have inhomogeneities greater than the parts per a million, which is required to reveal Larmor frequencies of different nuclear active sites, the distinguishing chemical properties that can be found are only $T_1$, $T_2$, and sometimes a diffusion coefficient (D).

Both of these measurements require the magnetization to be perturbed from its equilibrium state, alignment with the static field. These are measurements of the magnetizations rates to equilibrium from the perturbed states in the direction parallel and perpendicular to the $B_0$ field. A third return to equilibrium is possible known as $T_{rho}$, but is not commonly used downhole at this time.

The magnetization can be manipulated in order to cause the perturbation by the $B_1$ such that the measurements above for $T_1$ and $T_2$ can be made. Two specific manipulations are the main focus of most NMR experiments downhole. Other more complicated manipulations (rotation) are possible and can be useful, but only the two specific manipulations are discussed, since they are the most common. The first manipulation is a manipulation such that the magnetization is in the perpendicular plane, commonly called a "90" or "π/2" pulse. The second manipulation is an "inversion," that is to say, to cause the magnetization to point in the opposing direction. From equilibrium, the opposing direction would be in the anti-parallel direction. This pulse is commonly referred to as a "180" or "π" pulse. By timing the pulse length, or changing its amplitude, the magnetization can be rotated any amount.

Figure 6:
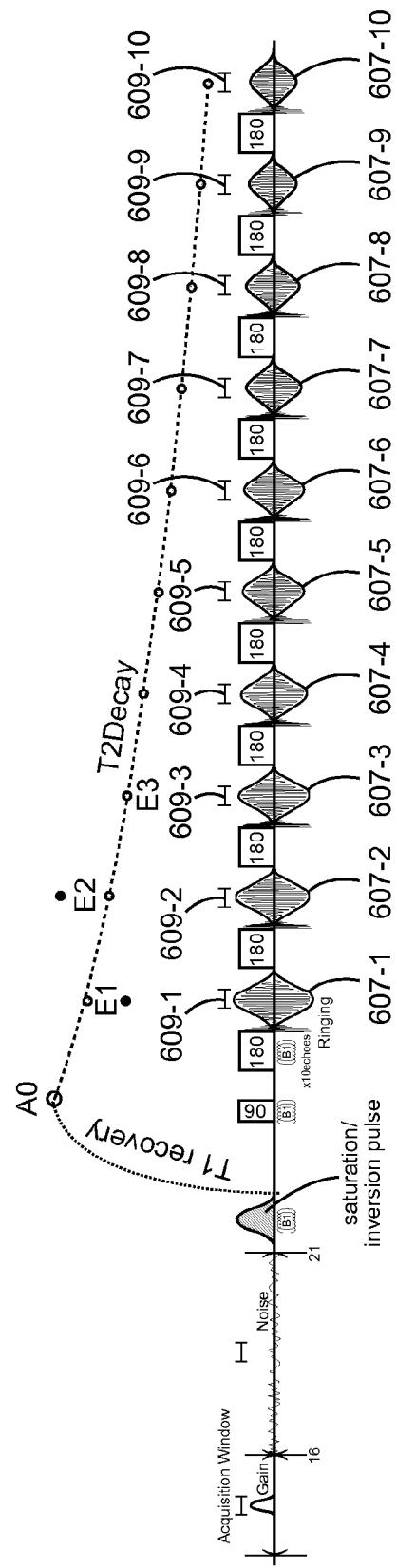
FIG. 6 is a representation of a sequence known as the Carr, Purcell, Meiboom, and Gill sequence.

The $T_2$ of the formation is heavily influenced by the formation and gradient of the tool. If a free induction decay (FID) were measured and the $T_2$ calculated would not be the intrinsic $T_2$, but a modified one known as $T_2^*$. A truer $T_2$ is achieved point by point by refocusing the magnetization with a sequence of 180 pulses, this T2 is still subjugated to irreversible losses due to diffusion and formation surface effects. The FID is then known as an Echo FID. The Echo FID is integrated to give a single value (called an Echo) and creates an Echo train. FIG. 6 is a representation of this sequence, which is known as the Carr, Purcell, Meiboom and Gill sequence (CPMG).

FIG. 6 illustrates use of a saturation pulse, a 90° tipping pulse, and a sequence of 180° refocusing pulses. In this non-limiting example sequence, ten 180° refocusing pulses cause ten echoes 607-1 . . . 607-10, where the peak amplitudes of the echoes are equally spaced apart by a peak to peak time distance, TE (echo time), that corresponds to the equally spaced apart time distances of the refocusing pulses. Refocusing pulses are not limited to ten pulses, but the number used may depend on the application and/or measurement parameters. Also indicated are an acquisition windows 609-1 . . . 609-10 for capturing the signal of an echo, a first echo $E_1$, a second echo $E_2$, a third echo $E_3$, and $A_0$. $A_0$ is the amplitude of the echo train at time zero. $A_0$ can be calculated by using an exponential decay fitting curve determined from a third echo $E_3$ to the last echo. $E_1$ and $E_2$ can be included if they are corrected. These echoes decay according to the $T_2$ of the medium. Once the nuclear spin population is fully recovered for the sequence, the medium can be probed again by another sequence.

A $T_1$ experiment downhole consists of a flipping or nulling of the magnetization in the positive z direction through a 180, 90, or saturation/inversion pulse followed by a CPGM sequence. The time between the nulling pulse and CPMG, designated as wait time (WT), is varied in the τ time domain. This allows for the built up magnetization in the z axis to be measured. Any number of wait times can be used with a minimum in a range of 2 to about 10; for example in practice, a minimum of 5 is used. There is no upper limit on how many WTs can be used; however, it is preferred to keep the number lower so that the vertical resolution of the data is kept minimal.

Figure 7:
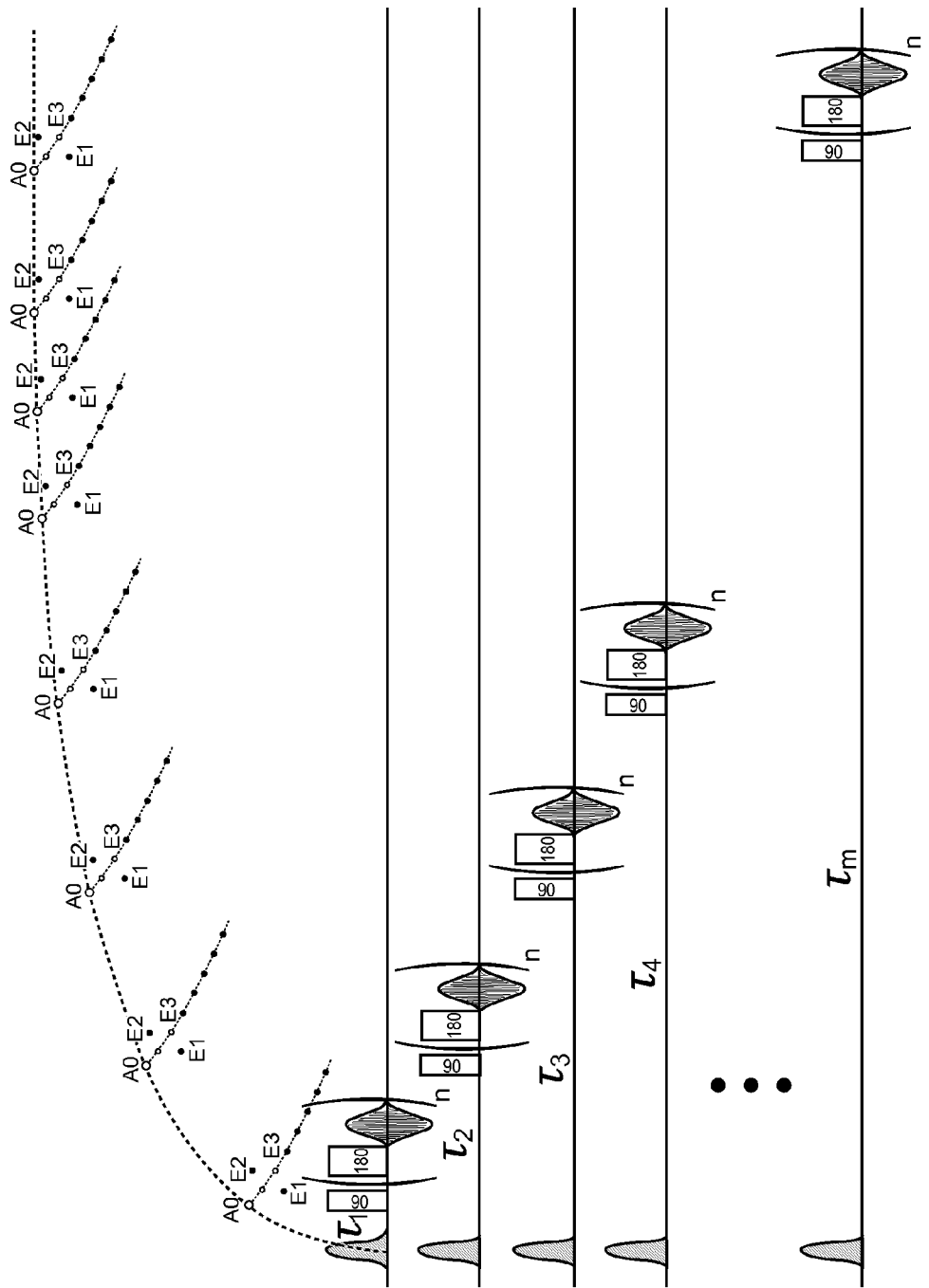
FIG. 7 is a diagram of a $T_1$ experiment.

FIG. 7 is a diagram of a $T_1$ experiment. The CPGM can have any number of echoes, and vary the number of echoes as the WT varies. Commonly, the longest wait time can have a significantly larger number of echoes taken. Lower WTs don't need as many echoes as less magnetization has recovered and the data decays into the noise quickly.

The NMR echo signal is commonly calculated by the equation:

$$s(t) = \left(1 - e^{-\frac{WT}{T_1}}\right) \cdot e^{-\frac{t}{T_2}} \cdot e^{-D(\gamma GTE)^2 t/12}, \quad (1)$$

where WT (wait time) is the time allowed for the magnetization to polarize, $T_1$ is the longitudinal recovery time constant, t is the time of the echo peak, $T_2$ is the transverse decay constant, D is the diffusion constant, γ is the gyromagnetic ratio, G is the gradient, and TE is the time between echoes.

The additional complexity in the NMR experiment, while logging, is the motion of the tool. The logging tool is pulled through the formation or could be on the back of a drilling string. In downhole logging, tools are pulled through the formation at speed typically between 30 ft/hr to 120 ft/hr. For wireline, the speed of pulling could be as high as 720 ft/hr. The rate at which a tool is pulled is referred to as a rate of penetration (ROP). This motion has several potential effects on the NMR echo trains to deviate it from equation (1), which causes the inversion to be incorrect. To the CPMG sequence, there are losses due to formation moving into a new zone while pulsing, in the $T_1$ experiment there can be over-call due to fresh zones after the saturation/inversion pulse, there are pre-polarization motion dependent effects due to magnetic field shape, a de-phasing, and additional rotation errors due to imperfect $B_1$.

Figure 8:
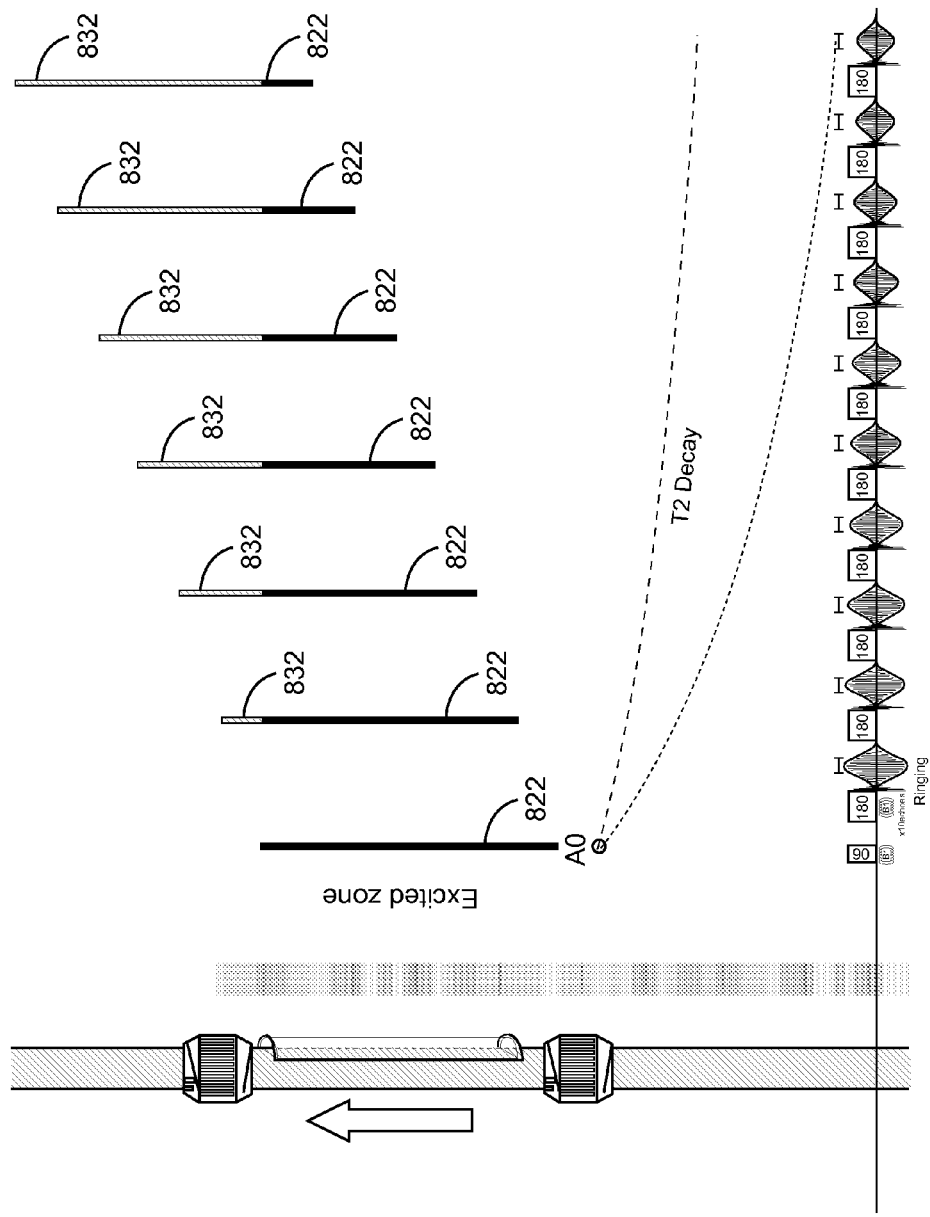
FIG. 8 is a demonstration of a nuclear magnetic resonance tool being pulled out of a borehole, while conducting nuclear magnetic resonance measurements.

Consider motion effects with respect to the CPMG. The CPMG has one "excitation" pulse. Commonly this is referred to as the "90" pulse. A 90 degree pulse is desired in order to get the most signal from the formation. As discussed below, this pulse may not be a true 90 pulse at all locations. Excited zone 822 is the only zone that will give signal from the recovery pulses. FIG. 8 is a demonstration of a tool 805 being pulled out of a borehole, while conducting NMR measurements. As the tool 805 moves, the 180 pulses are used on a zone 832 that was not excited by the 90 pulse. This means that signal is progressively lost. In the inversion, this does not cause an error to A0 (maximal signal) but will shift the inversion $T_2$ spectra such that the $T_2$ appear smaller.

Figure 9:
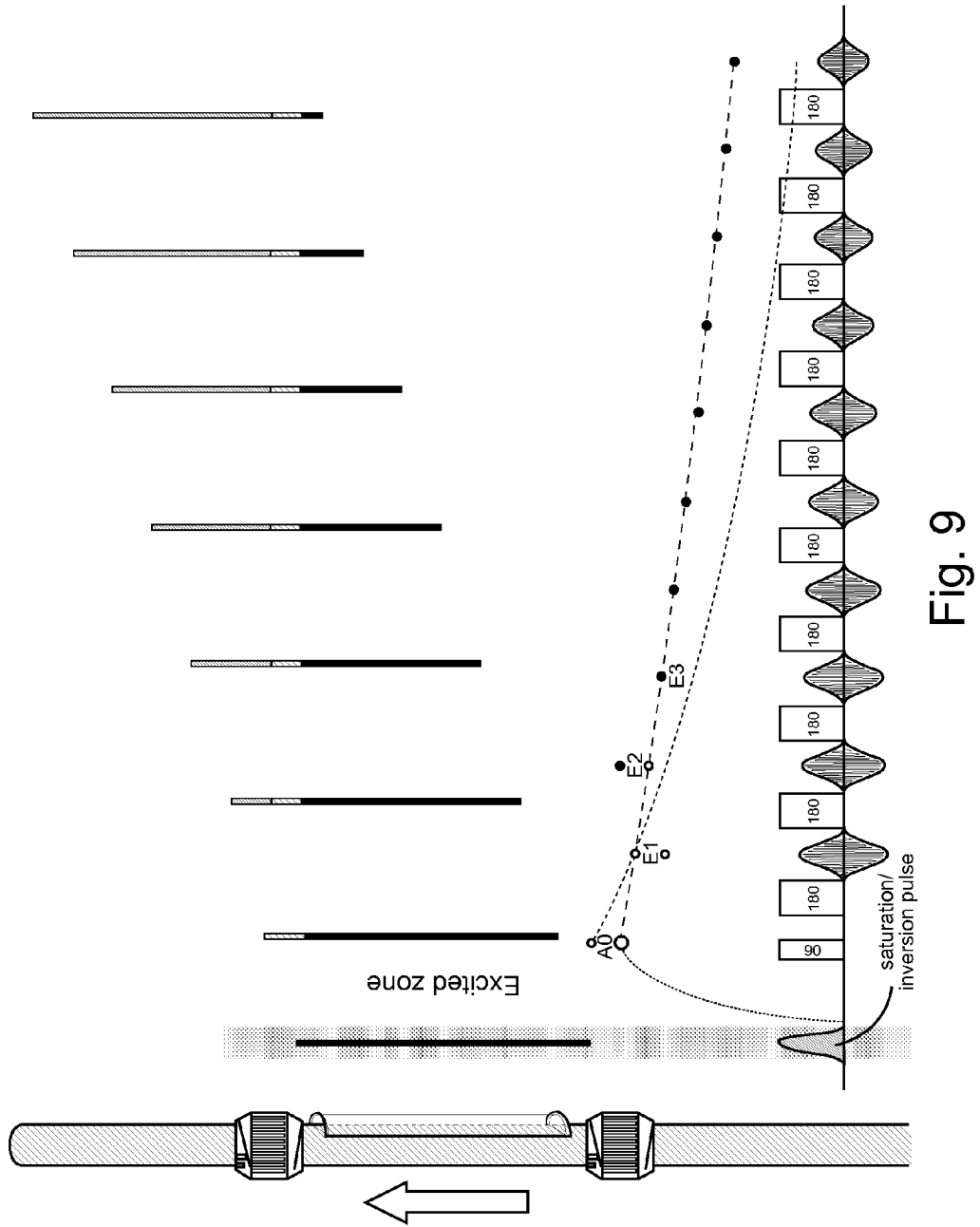
FIG. 9 is a representation of a Carr, Purcell, Meiboom, and Gill sequence following the $T_1$ recovery of the nuclear magnetic resonance tool of FIG. 8 being pulled out of a borehole, while conducting nuclear magnetic resonance measurements.
Figure 10:
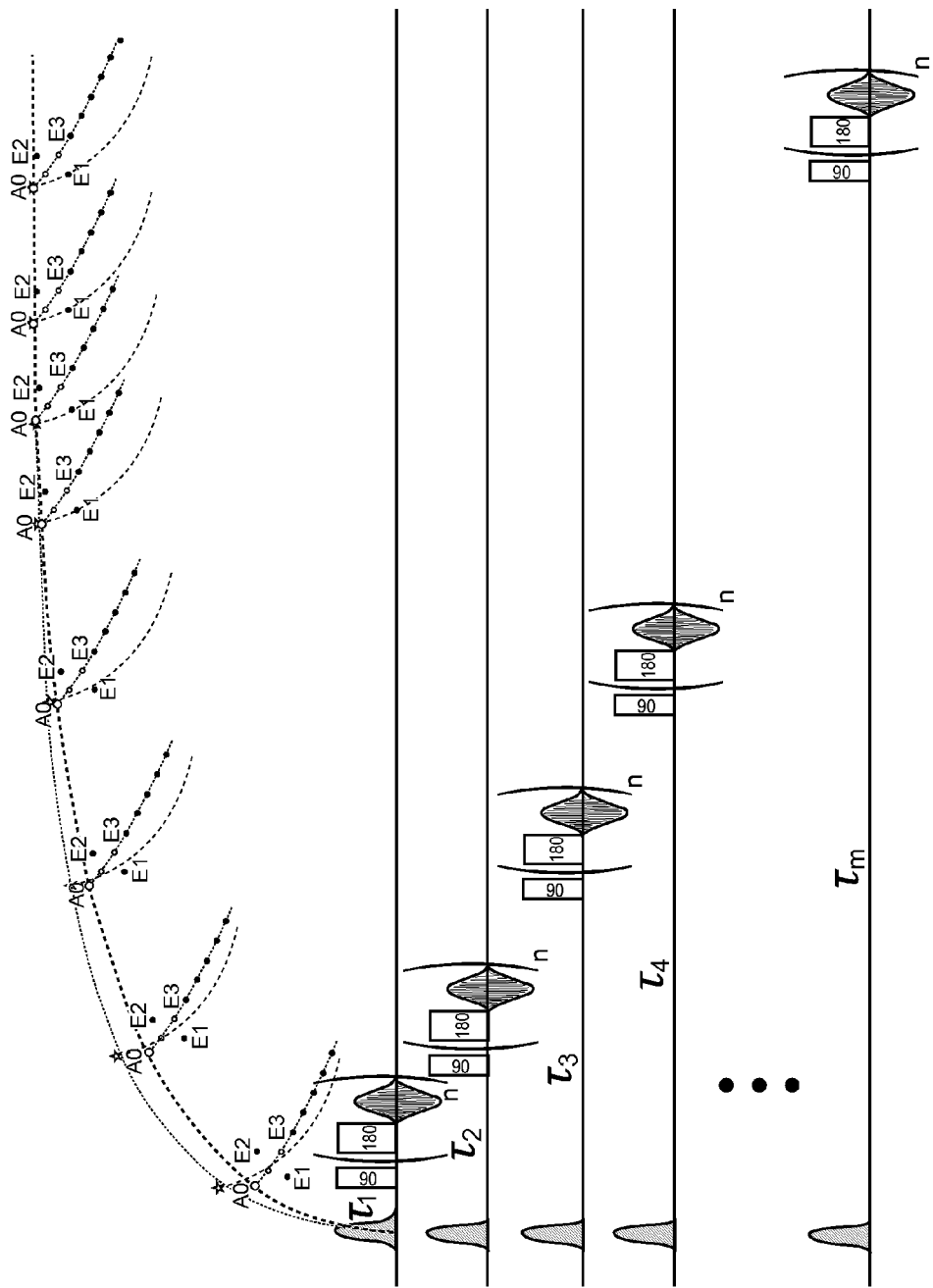
FIG. 10 is a representation of $A_0$ being artificially high for medium wait times caused by over polarization.

Consider motion effects with respect to the $T_1$ Recovery. The $T_1$ experiment starts with a saturation/inversion pulse. This pulse is designed to "kill" the magnetization. This could be thought of as a scrambling of the magnetization into all orientations or simply putting it into the transverse plane. Directly after the saturation/inversion pulse no signal should be achievable. As $T_1$ experiments are an inquiry as to how fast the magnetization builds in the $B_0$ direction, several experiments are done to vary the allotted recovery time, WT, after the saturation/inversion pulse. Following the recovery is a CPMG sequence, as shown in FIG. 9. The CPMG sequence will suffer the same losses as described above. During the wait time, the tool moves and so does the volume of inquiry. When the 90 pulse is applied some of the excited zone is not touched by the previous saturation/inversion pulse and will be 100% polarized. That over polarization causes the $A_0$ to be artificially high for medium wait times as shown in FIG. 10. At short wait times the tool has not moved much so the effect is not seen and long wait times should be 100% polarized so the motion has no effect.

Considering prepolarization, the majority of logging tools have magnets that are stronger preceding the NMR zone. The magnetization will relax according to the field strength it feels.

$$M(t_{i+1}) = M_i + (\chi B_0(r,z) - M_i) \cdot (1 - e^{-\Delta t/T_1}) \quad (2)$$

Figure 11:
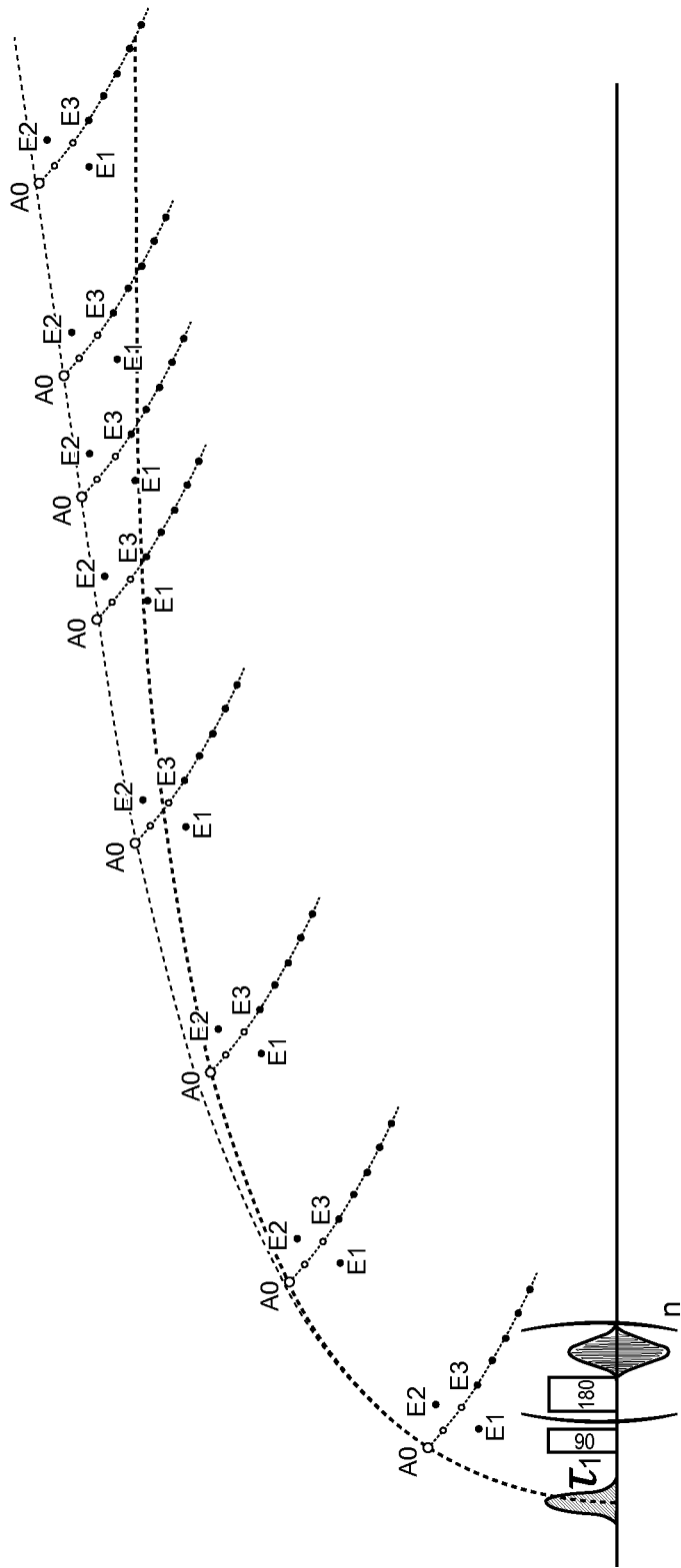
FIG. 11 is a representation of a result from a pseudo integration of all the magnetic field felt until the time of interest in conducting nuclear magnetic resonance measurements.

It builds up according to the field it is currently in, and how much magnetization is currently there. Essentially, it is a pseudo integration of all the magnetic field it has felt until the time of interest. This means magnetization could be higher or lower than if it were polarizing in a stationary magnetic field, $M = \chi \square_0 (1 - e^{-\Delta t/T_1})$. This causes the possible amount of signal to be different from the stationary case. See FIG. 11.

The diffusion effect in NMR is generally due to the random motion that occurs in the formation. It causes an irreversible decay in the echo train due to irrecoverable dephasing. The magnetization undergoes various magnetic fields as it moves through a gradient picking up different phases at each location. The same happens as the tool moves. The magnetization also undergoes different magnetic field strengths via pulling, which mathematically looks exactly the same as a diffusion, $$D = \frac{\lambda^2}{2\tau}.$$

Figure 12:
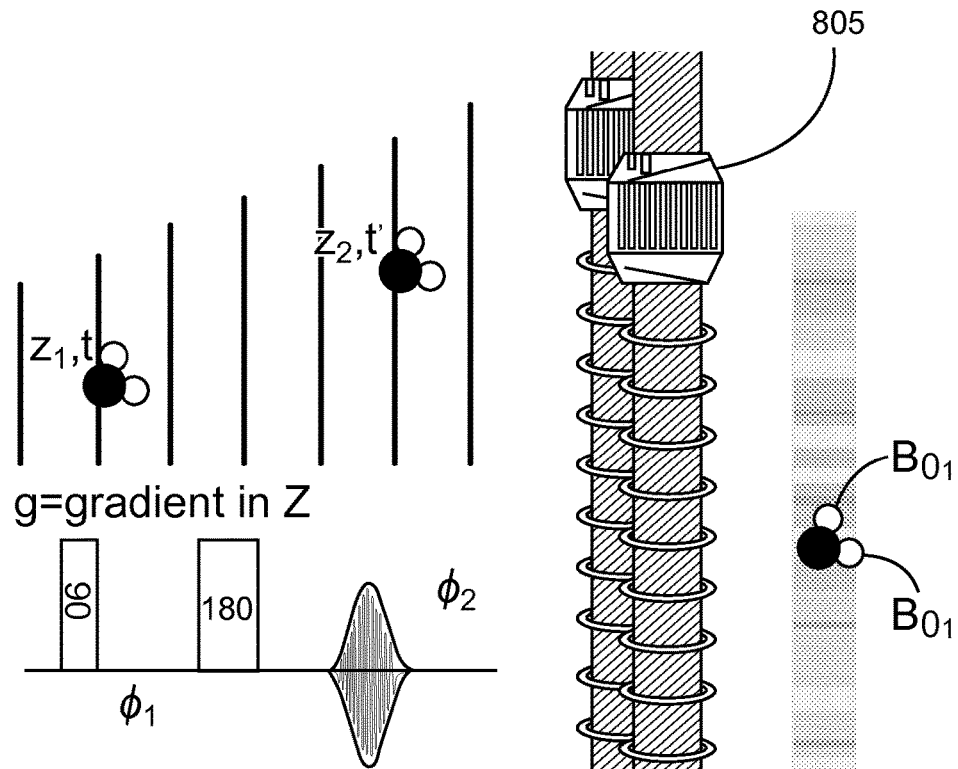
FIG. 12 is a representation of additional phase scrambling in nuclear magnetic resonance measurements due to pulling the tool in the borehole.

Additional de-phasing due to pulling is shown in FIG. 12 with respect to pulling the NMR tool 805.

Consider problems with $B_1$ inhomogeneity. There are inconsistencies in the $B_1$ field. The $B_1$ field naturally falls off in a logging tool as it is facing outward. The higher frequencies tend to be closer to the logging tool, where the $B_1$ is stronger. A pulse excites not only the center frequency, but a bandwidth around it, $BW=1/\tau_{pulse}$. This means that the frequencies closer to the tool will tend to tip more than the further ones. Because there is a spread of tipping angles, there is some departure from the echo prediction equation in itself, but adding motion atop of it, causes even more distortions.

When an inversion is performed on the echoes from a real logging tool, all of these differences from the simplistic view of signal are there. That means, if the data is inverted against a matrix created with equation (1), there can be errors in A0 and in the spectra. Mostly, this can cause shifts in to $T_1$s, and $T_2$s such that they become shorter and subsequently for A0 to be over called.

In an embodiment, a solution presented here is to invert against a more realistic matrix. The NMR tool acquires echoes based on the pulse sequence used, where this data is designated as s(t). To interpret the data s(t) is inverted into different basis: $T_2$, $T_1$, or D. To perform this inversion, the data is fit to known answers.

$$s(t) = \sum_{ij} x_{ij} \cdot A(T_{1i}, T_{2j}) \qquad (3)$$

When the tool is stationary, the signal, omitting surface/volume interaction, is known to have the form:

$$jth \text{ Echo: } y^k(j) = \sum_{i=1}^{p} x_i \cdot \left(1 - e^{-\frac{WT_k}{T_{1i}}}\right) \cdot e^{-\frac{j \cdot TE}{T_{2i}}} \cdot e^{-\frac{D(\gamma GTE)^2 \cdot j \cdot TE}{12}}, \qquad (4)$$

which is simplified by relating $T_{1i}$ and $T_{2j}$ by a factor and considering only one inner echo time (TE). However, the discussed methods here can be used for any number of dimensions available in the above equation (4). Considering the standard $T_1$ experiment:

$$nth \text{ Echo: } y^k(j) = \sum_{i=1}^{p} x_i \cdot \left(1 - e^{-\frac{WT_k}{T_{1i}}}\right) \cdot e^{-\frac{j \cdot TE}{T_{2i}}} \cdot e^{-\frac{D(\gamma GTE)^2 \cdot j \cdot TE}{12}} \qquad (5)$$

Here, $WT_k$ is the recovery time, TE is the inter echo spacing, G is the gradient, $T_{1i}$ and $T_{2i}$ time constants are related, p is the total number of $T_1$ components, and $x_i$ is the corresponding amplitude.

The above equation (5) can be written in matrix as below:

$$\begin{aligned}WT1 \text{ data}&\begin{cases}y^1(1)\\y^1(2)\\\ldots\\y^1(n_1)\end{cases}\\WT2 \text{ data}&\begin{cases}y^2(1)\\y^2(2)\\\ldots\\y^2(n_2)\\\ldots\end{cases}\\WTm&\begin{cases}y^m(1)\\y^m(2)\\\ldots\\y^m(n_m)\\\ldots\end{cases}\end{aligned} = \begin{bmatrix}A^1_{11} & A^1_{21} & A^1_{p1}\\A^1_{12} & A^1_{22} & A^1_{p2}\\\ldots & \ldots & \ldots\\A^1_{1n_1} & A^1_{2n_1} & A^1_{pn_1}\\A^2_{11} & A^2_{21} & A^2_{p1}\\A^2_{12} & A^2_{22} & A^2_{p2}\\\ldots & \ldots & \ldots\\A^2_{1n_2} & A^2_{2n_2} & A^2_{pn_2}\\\ldots & \ldots & \ldots\\A^m_{11} & A^m_{21} & A^m_{p1}\\A^m_{12} & A^m_{21} & A^m_{p1}\\\ldots & \ldots & \ldots\\A^m_{1n_m} & A^m_{2n_m} & A^m_{p2n_m}\end{bmatrix}\begin{bmatrix}x_1\\x_2\\x_3\\\ldots\\x_p\end{bmatrix} \qquad (6)$$

where $$A^k_{ij} = \left(1 - e^{-\frac{TW_k}{T_{1i}}}\right) \cdot e^{-\frac{j \cdot TE}{T_{2i}}}$$

is the jth echo associated with the kth recovery time $TW_k$, j is the echo number, $T_{1i}$, $T_{2i}$ are corresponding $T_1$ and $T_2$ constants, m is the total number of recovery times, and p the total number of $T_1$ components.

The above equation (6) can be shortened as $$Y = AX, \qquad (7\text{-}1)$$

where $$Y = \begin{bmatrix}y^1(1)\\y^1(2)\\\ldots\\y^1(n_1)\\y^2(1)\\y^2(2)\\\ldots\\y^2(n_2)\\\ldots\\y^m(1)\\y^m(2)\\\ldots\\y^m(n_m)\\\ldots\end{bmatrix}, A = \begin{bmatrix}\vec{A}^k_1 & \vec{A}^k_2 & \ldots & \vec{A}^k_p\end{bmatrix}, X = \begin{bmatrix}x_1\\x_2\\x_3\\\ldots\\x_p\end{bmatrix}, \text{ and}$$

-continued $$\vec{A}_i^k = \begin{bmatrix} A_{i1}^1 \\ A_{i2}^1 \\ \ldots \\ A_{in_1}^1 \\ A_{i1}^2 \\ A_{i2}^2 \\ \ldots \\ A_{in_2}^2 \\ \ldots \\ A_{i1}^m \\ A_{i1}^m \\ \ldots \\ A_{i2n_m}^m \end{bmatrix}$$ is the column vector.

$\vec{A}_j^k$ can be re-written as:

$$\vec{A}_i^k = \begin{bmatrix} B_i^1 \\ B_i^2 \\ \ldots \\ B_i^m \end{bmatrix},$$

where $$\vec{B}_i^k = \begin{bmatrix} A_{i1}^k \\ A_{i2}^k \\ \ldots \\ A_{in_4}^m \end{bmatrix}.$$

So, $B_i^k$ is echo train with recovery time $TW_k$, $T_1=T_{1i}$, $T_2=T_{2i}$, and $n_k$ number of echoes, and $\vec{A}_k^k$ is the combined echo trains with all recovery times $TW_1$, $TW_2$, ... and $TW_{mb}$, but the same T1 and T2. $\vec{A}_i^k$ is called single T1 component echo vector.

So the spectrum vector X is given by:

$$X = A^{-1}Y \quad (7\text{-}2)$$

The magnetization, M(t), is a function of speed, v, while logging. $T_2$ decay, and $T_1$ recovery time, $B_0$ distribution, and initial magnetization history are variables of time, M(t→time). When the tool is moving with speed v, a single component echo vector $\vec{A}_j^k$ varies with speed and is denoted as $\vec{A}_j^k(v)$, and corresponding Y becomes Y(v), but X stays unchanged, because X is intrinsic property of formation.

Equation (7-1) can be re-written as $$Y(v) = A(v)X, \quad (8\text{-}1)$$

and the solution $X = A(v)^{-1}Y(v)$ (8-2)

If the inverse of stationary matrix A is used in equation (3-2), the result is $$X^* = A^{-1}Y(v) = A^{-1}A(v)X. \quad (8\text{-}3)$$

Since A(v) is different from the stationary A due to $B_0$ inhomogeneity, $A^{-1}A(v)$ is not equal to unit matrix I. So, $X^*$ is not the same as X. In other words, if the stationary matrix A is used with moving data, an error would be created. This is called motion effect.

Consider corrections to $X^*$. The term $X^*$ can be corrected by the following equation:

$$X = A(v)^{-1}AX^*, \quad (9)$$

where $A(v)^{-1}A$ is called the motion correction matrix.

The term A can be calculated directly. As shown above, constructing A(v) matrix under different speed is a key to removing motion effect. Correct inversion can be achieved either by using correct A(v) (motion dependent) in inversion or using A(standard) but with $A(v)^{-1}A$ correction.

As shown above, the column vector in A(v) is the combined single component echo train. If $B_0$ is known, A(v) matrix can be calculated either analytically or through simulation. Because A(v) is a function of speed and $T_1/T_2$ values, the combination of different speed and different $T_1/T_2$ value is big, the amount of computation is huge. One way to reduce computation is to decrease the number of different speeds but interpolate/extrapolate to correct speed. Another technique is to adjust the number of $T_1/T_2$ components (bins).

Consider equation modification. A first approach in creating a different A(v) can be to modify the predicting equations by multiplying additional functions, which predict these perturbations.

$$S(t) = E(\text{CPMG}) \cdot F(T1\text{fresh}) \cdot D(\text{ROP diffusion}) \cdot M(\text{prepolarize}) \cdot B(B1) \quad (10)$$

The function E(CPMG) represents the losses in the CPMG. For a simple long, cylindrical, field this can be represented by:

$$E(CPMG) = e^{-\frac{t}{T2}} \cdot \left(1 - \frac{ROP * t}{\text{Length of sensitive volume}}\right) \quad (11)$$

The function $F(T_1\text{fresh})$ represents the fresh zone, which appears in a T1 experiment during the wait time.

$$F(T1\text{ fresh}) = \left(\left(1 - \frac{ROP * WT}{\text{Length of sensitive volume}}\right) * \left(1 - e^{-\frac{WT}{T_1}}\right) + \left(\frac{ROP * WT}{\text{Length of sensitive volume}}\right)\right). \quad (12)$$

The function D(ROP diffusion) is a diffusion factor which takes into account the motion of the tool. The diffusion constant is defined as:

$$D = \frac{\lambda^2}{2\tau},$$

where $\lambda$ is the mean distance traveled during time $\tau$. So the diffusion constant for motion would be:

$$D_{ROP} = \frac{(ROP \cdot TE)^2}{2 \cdot TE} = \frac{ROP^2 \cdot TE}{2}, \quad (13)$$

$$D(ROPDiff) - e^{-\frac{D(\gamma OTE)^2 \tau}{12}}, \quad (14)$$

$$e^{-\frac{ROP^2 \cdot TE}{2}(\gamma OTE)^2 \tau}{12} - e^{-\frac{\left(D + \frac{ROP^2 \cdot TE}{2}\right)(\gamma GTE)^2 \tau}{12}}$$

Figure 13:
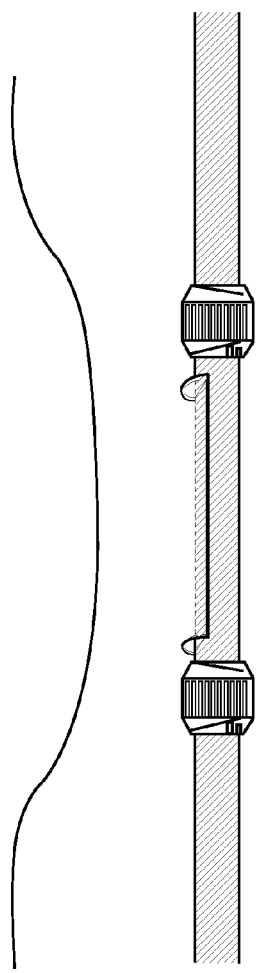
FIG. 13 is a representation of a field of a tool along its axis as a one-dimensional line.

The function M(prepolarize) compensates for the over or rarely under polarization that happens due to the far ends of the magnets. This takes some knowledge of the magnetic field shape. A simplistic one-dimensional (1D) line can be used to represent the field of a tool along its axis as shown in FIG. 13. A more complex two-dimensional (2D) or three-dimensional (3D) mapping can represent the magnetic field. The function discussed above (equation (2))

$$M(t_{i+1})=M_i+(\chi B_0(r;z)-M_i)\cdot(1-e^{-\Delta t/T1})$$

is then utilized for different $T_1$s. Using a finite element approach or representing the field as a series of equations, the pre-polarization can be found and either held as a table to call or made into a unique equation for a particular magnetic field:

Pre-polarization relations can be given by:

$$\frac{dM}{dt} = 1/T1(\chi B_0(t,v) - M(t)) \quad (15)$$

$$\frac{dM}{dt} + \frac{M}{T1} = \chi B_0(t,v)/T1$$

$$\frac{dM}{dt}*e^{t/T1} + M*\frac{d(e^{t/T1})}{dt} = \chi B_0(t,v)/T1*e^{t/T1}$$

$$\frac{dM}{dt}*e^{t/T1} + M*\frac{d(e^{t/T1})}{dt} = \chi B_0(t,v)/T1*e^{-t/T1}$$

$$\frac{d(Me^{t/T1})}{dt} = \chi B_0(t,v)/T1*e^{-t/T1}$$

$$M(t)e^{\frac{1}{T1}} = \int \frac{\chi B_\epsilon(t,v)}{T1} *e^{-\frac{t}{T1}}dt$$

where $B_0$ is a function of moving speed v and time t, since $B_0$ is function of coordinate R.

Countering the imperfect $B_1$ is a little more challenging than a simple multiplier, though one might be created for specific fields, after using the single spin simulation, or full volume simulation described below.

Figure 14:
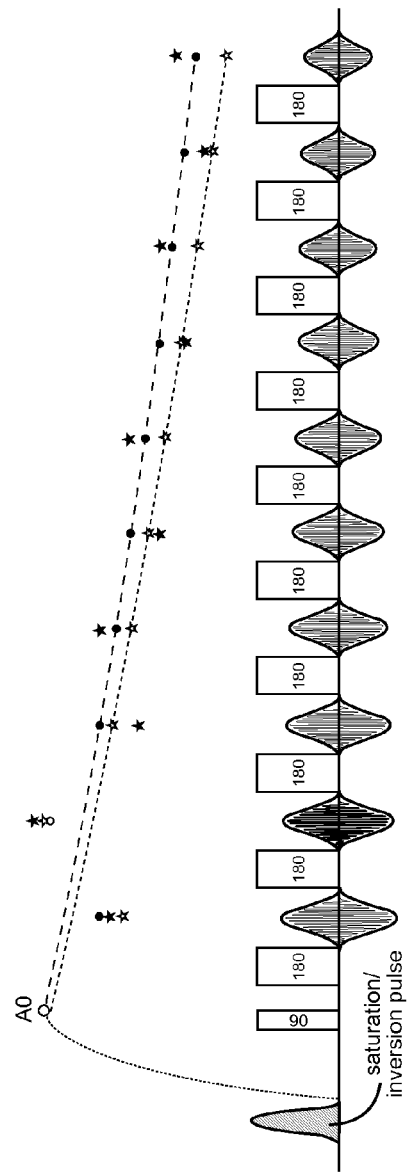
FIG. 14 is a representation of a decrease in echo amplitude as the echo train proceeds due to imperfect radio frequency field magnetic field.

Consider single spin simulation. With imperfect $B_1$, the magnetization will generally be under tipped, but on the next pulse it could be over tipped, which may create a systematic noise like raising and lowering of the echoes or may cause a simple decrease in echo amplitude as the echo train proceeds as shown in FIG. 14. Following a single spin through the pulse rotations is the simplest way to understand and predict the behavior of inhomogeneous $B_1$.

A vector, M, is designated which represent the magnetization of the system. The initial magnitude of this vector can be found using the function for P(prepolarize) above. The magnetization will then be rotated and allowed to freely precess as it would during the pulse sequence. The "90" and "180" rotations may not be perfect, but may be of a different value than 90 or 180, which simulates an imperfect B1. For example, consider the following M=0 via chirp M=M(prepolarize)

M=R"90"M where $R_\theta$ is a rotation matrix:

$$R_x(\theta) = \begin{bmatrix} 1 & 0 & 0 \\ 0 & \cos\theta & -\sin\theta \\ 0 & \sin\theta & \cos\theta \end{bmatrix} \quad (16)$$

$$R_y(\theta) = \begin{bmatrix} \cos\theta & 0 & \sin\theta \\ 0 & 1 & 0 \\ -\sin\theta & 0 & \cos\theta \end{bmatrix}$$

$$R_z(\theta) = \begin{bmatrix} \cos\theta & -\sin\theta & 0 \\ \sin\theta & \cos\theta & 0 \\ 0 & 0 & 1 \end{bmatrix}.$$

Following the 90 pulse, the magnetization is allowed to freely precess:

$$M=(R_{FID,\theta}M)\cdot[E(CPMG)\cdot F(T1\text{fresh})\cdot D(\text{ROP diffusion})\cdot M(\text{polarize})] \quad (17)$$

This can be done in one step or more accurately by small $\Delta$ts which will add up to the TE/2:

$$\theta = \frac{\Delta t}{2}\omega$$

$$\omega = 2\pi f$$

Then, the 180 train is repeated for echo train length:

$$M = R_{180}\cdot M \quad (18)$$

$$M = (R_{FID,\theta|t=TE}M)\cdot$$
$$[E(CPMG)\cdot F(T1\text{ fresh})\cdot D(ROP\text{ diffusion})\cdot M(\text{polarize})]$$

$$\theta = \frac{\Delta t}{2}\omega$$

$$\omega = 2\pi f$$

The echo may be recorded for each $\Delta$t or solely at the peak of the echoes (increments of TE). It is possible to include a spreading function to add to this process which might simulate the real system better.

Full simulation of $B_0$ and $B_1$ interaction while pulling can be performed. A way of creating "A" more accurately presented herein is to simulate the echo train completely mathematically through knowledge of the $B_0$ and $B_1$. The $B_0$ and $B_1$ may be acquired either through simulation or by measuring the field from real logging tool with a Gauss meter. The field may be represented as a series of equations along the tool or by cutting it into some sort of mesh. At each mesh point, the NMR contribution can be found and it's time dependence calculated as it was for a single point. However, now different $B_1$ inhomogeneities and NMR frequencies can be taken into account according to the $B_1$ and $B_0$ geometries.

$$M(t)=s(t)=\int_0^T \text{local magnetization}(t)dt \quad (19)$$

Figure 15:
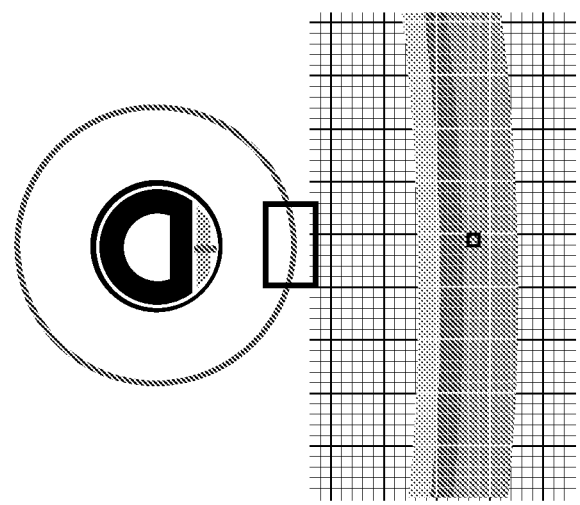
FIG. 15 is a pictorial representation of a grid mesh field.

FIG. 15 is a pictorial representation of a grid mesh field. The parameters for this approach may include $\tau$=length of a pulse with a bandwidth given by BW=$1/\tau_{180}$, center frequency of $\omega_{center}=-\gamma B_0$, minimum frequency of $\omega_{min}=-2\pi\gamma B_0-\frac{1}{2}$BW, and maximum frequency of $\omega$max=$-2\pi\gamma B_0+\frac{1}{2}$BW. At each corner, the $B_1$ and $B_0$ would be calculated then, a magnetization calculated, and rotated through time. An echo train can be followed through this grid.

Figure 16:
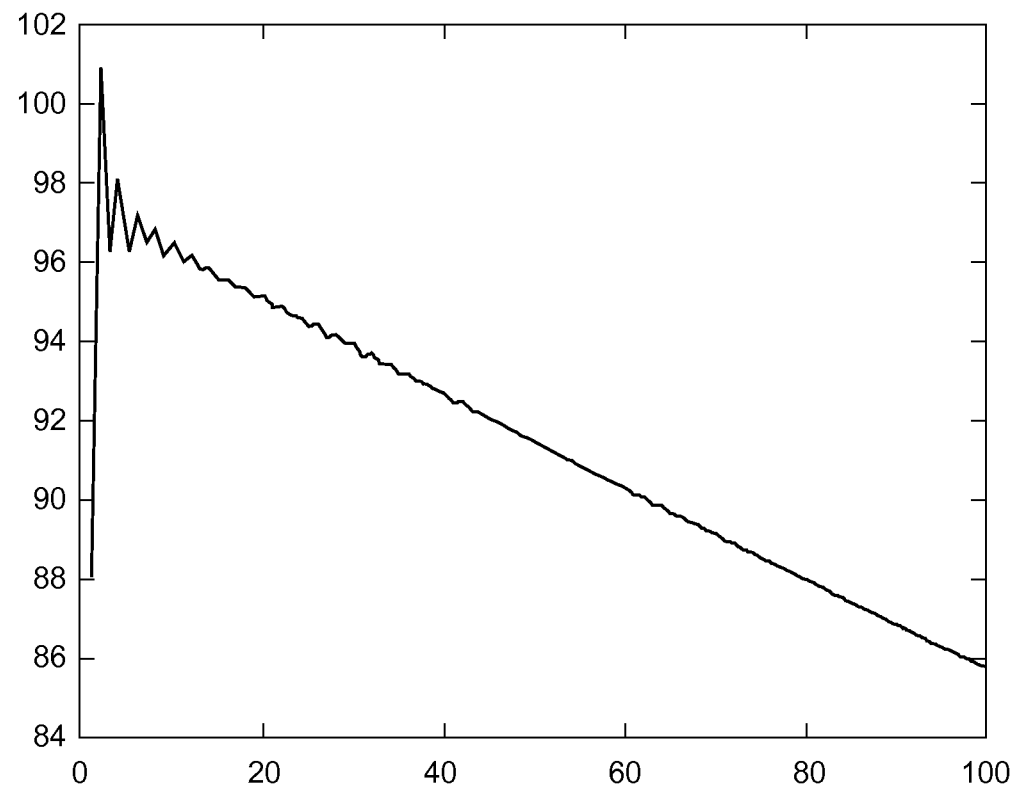
FIG. 16 is an example a simulated echo train.
Figure 17:
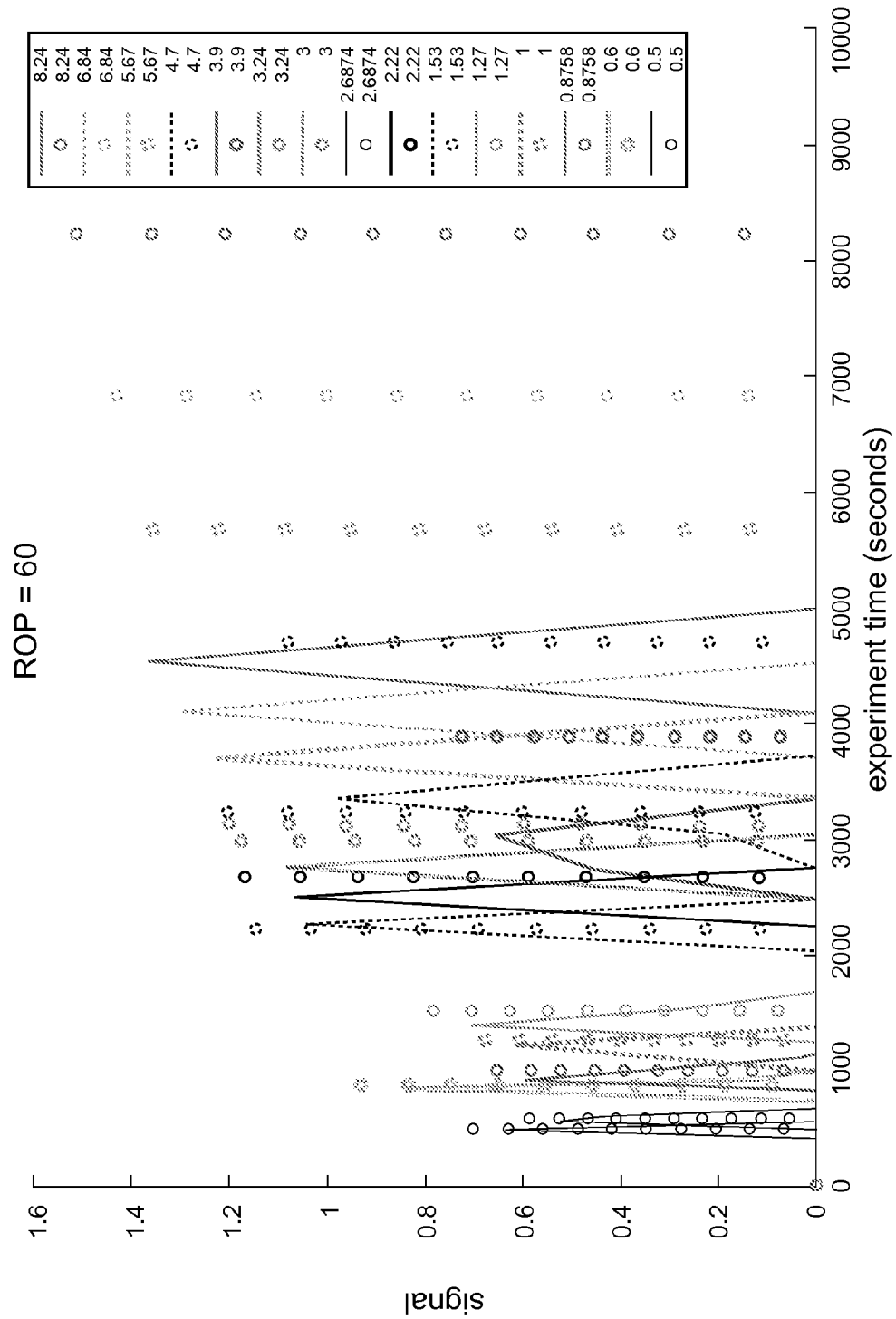
FIG. 17 is a representation of where $T_1$ points should be in a plot of signal versus experiment $T_1$ time for an example fast ROP experiment.

An example of a simulated echo train is shown in FIG. 16. The inversion of such data is shown in FIG. 17 where the $T_1$ spectra are shifted to shorter $T_1$ and where the porosity is calculated too high. Dots in FIG. 17 represent where the $T_1$ should be.

Figure 18:
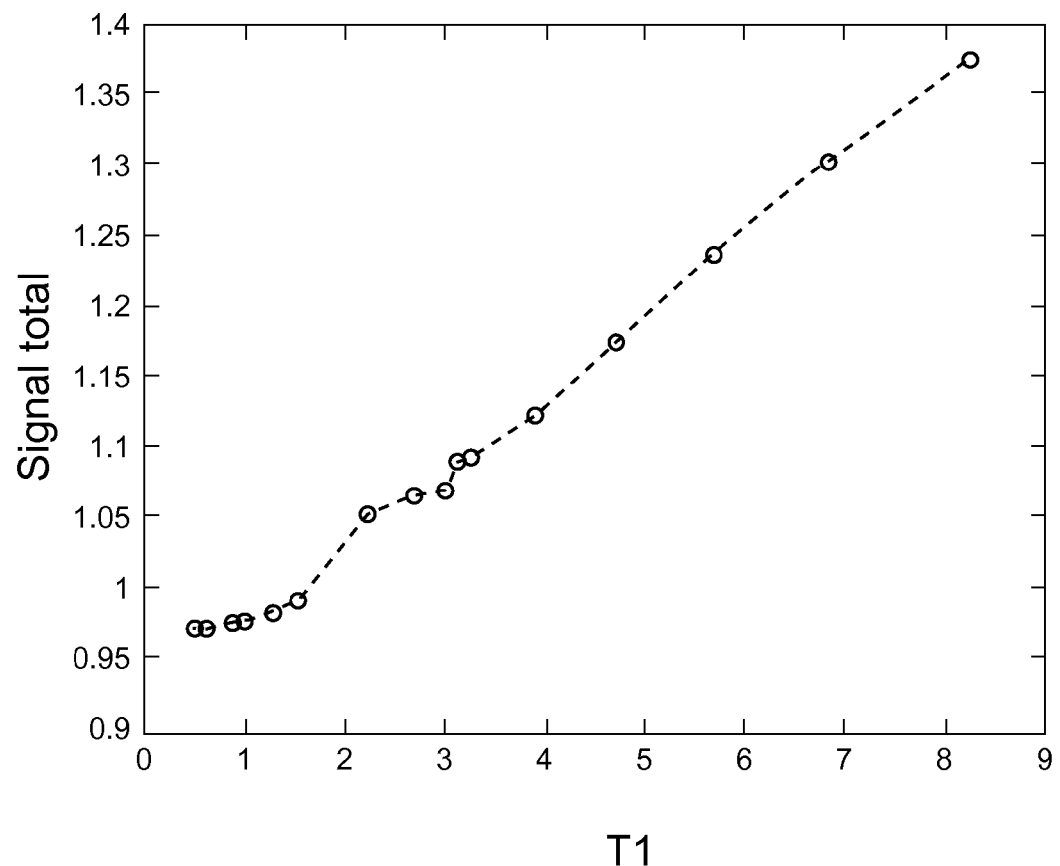
FIG. 18 is an example of a plot of porosity versus $T_1$ for a high ROP when standard the inversion is used.
Figure 19:
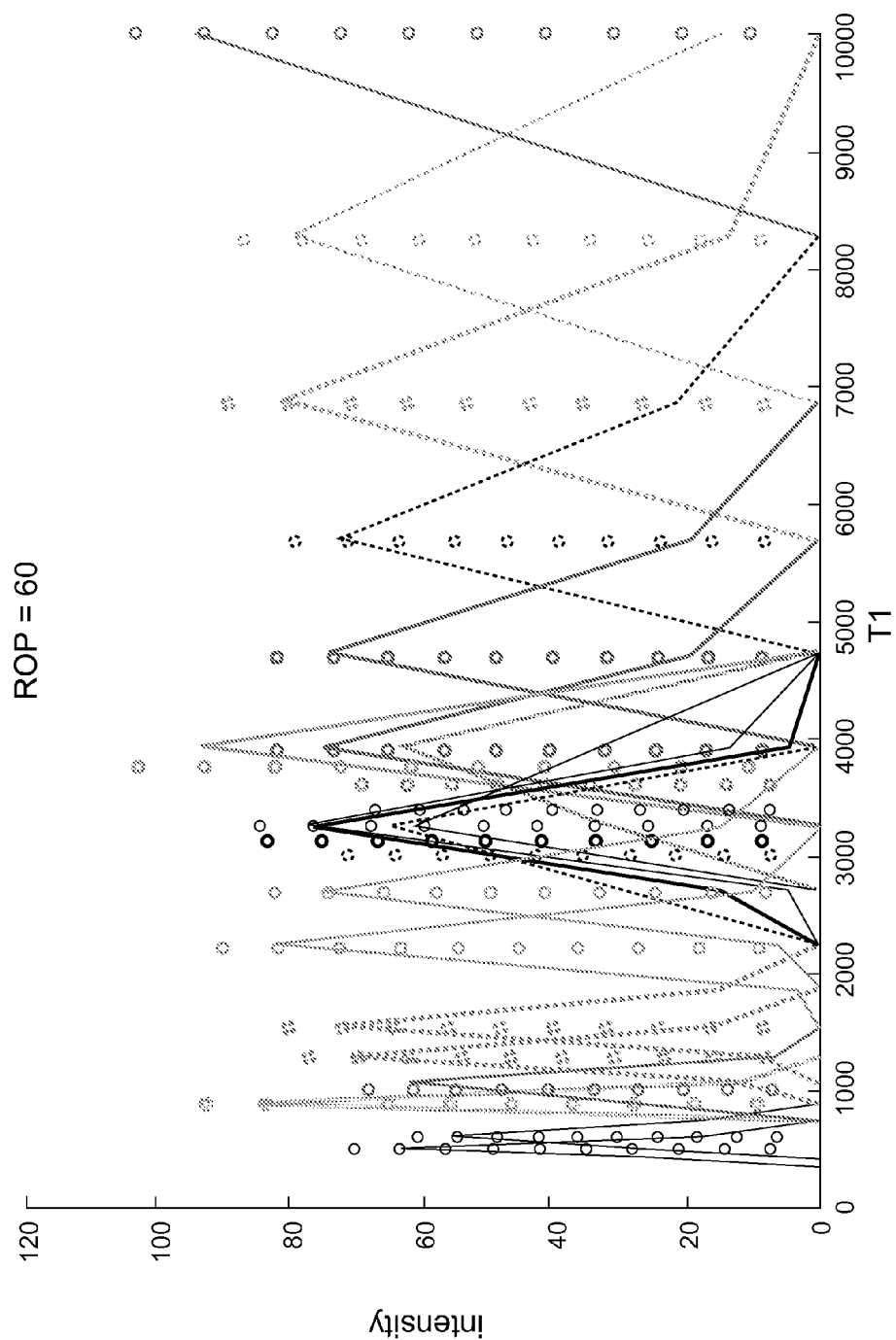
FIG. 19 is an example of a plot of intensity versus $T_1$ of theoretical data using the new inversion method.
Figure 20:
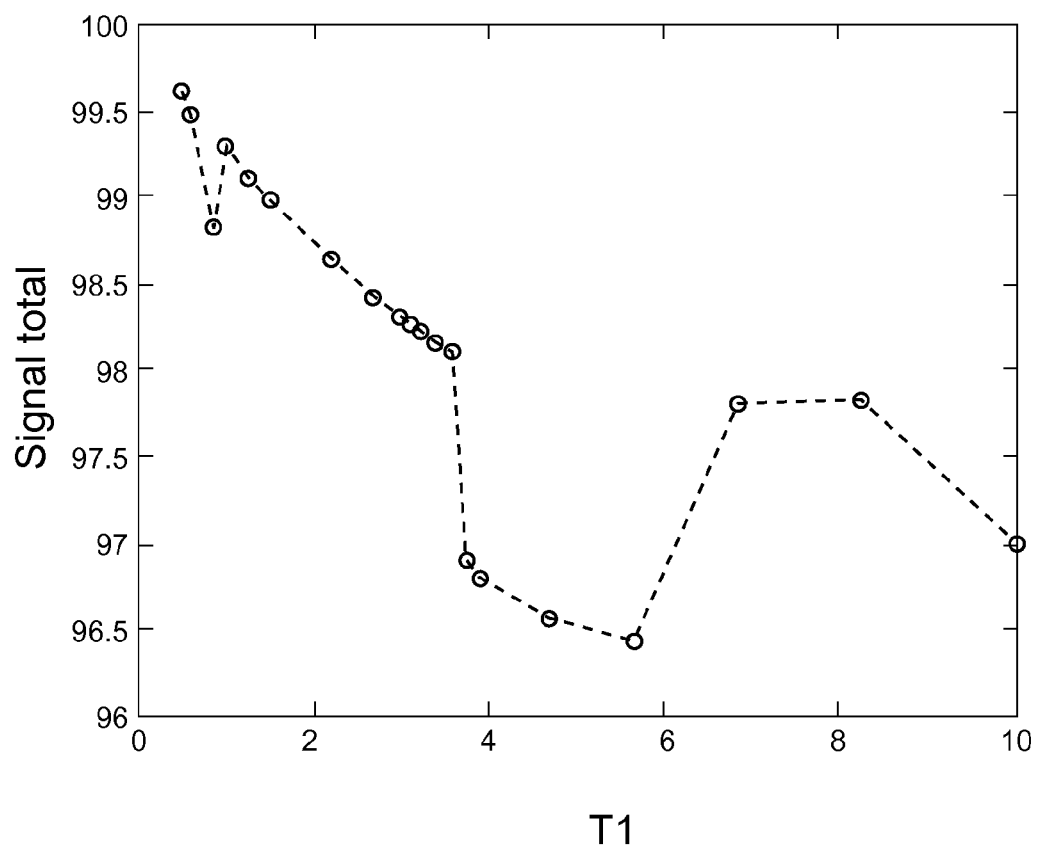
FIG. 20 is a representation showing the porosity vs T1 when using the new inversion method.

Each point in FIG. 18 is an example of total signal versus $T_1$ when a single T1 is inverted using the stationary "A". Porosity of each inversion vs $T_1$ can be conducted using regular SVD inversion. FIG. 19 is an example of a plot of inversion intensity versus $T_1$ using the simulated A(v). When the correct "A" is used from a full $B_0$ and $B_1$, the inversion has the peaks at the correct $T_1$s and the porosity is near 100 PU where it should be instead of over calling. Dots in FIG. 19 represent where the $T_1$ should be with SNR=300. FIG. 20 is a representation showing the porosity vs T1, using A(v) in inversion. Porosity of each inversion vs $T_1$ from new inversion no longer overcall the signal.

In various embodiments, a method includes a motion correction that incorporates the distortions due to $T_2$ signal loss, $T_1$ over call, over polarization, and $B_1$ inhomogeneities all at once, by either finding a corrective matrix to fix the stationary inversion. In another approach, by knowing the true form the echo train would have with a particular $B_1$ and $B_0$ and inverting that data, motion correction can be attained. Having a more reliable inversion may give correct porosity and $T_2$, $T_1$, and D spectra.

The discussion herein includes a discussion of an embodiment of a novel technique for data processing to achieve reliable data while drilling or pulling. This technique accounts for the effects of motion and imperfect RF magnetic field $B_1$ using simulation of the tool's static magnetic field $B_0$ and $B_1$. The technique is demonstrated using $T_1$ data, but can be also used with $T_2$.

NMR logging while drilling (LWD) is an important formation evaluation and geosteering tool that has gained increased use within the industry. The low-magnetic-field gradient NMR while-drilling design has an advantage of a larger sensitive volume with a small-dimension antenna aperture to potentially provide high-resolution logs. In addition, the wide sensitive volume reduces the detrimental effect of lateral vibration to the NMR measurements. On the contrary, the small aperture antenna is more axial-motion sensitive, especially for $T_1$ measurements in a slow-relaxation formation, where a long wait-time (TW) could result in a nontrivial fresh volume during the time period, rendering incorrect signal strength and, if uncorrected, can affect the overall porosity and shift the $T_1$ distribution nonlinearly.

In various embodiments, an LWD NMR tool can be realized by a tool with a gradient magnet field varying from of about 1 gauss/cm-6 gauss/cm in the direction of investigation (DOI) of the sensitive volume. In another embodiment, a wireline logging tool could be used, which can be pulled quickly. The wireline logging tool can be realized by a long, high gradient wireline logging tool that can be pulled quickly.

The principle of an NMR experiment is the detection of bulk nuclear magnetization, which gains a preferred orientation in a magnetic field. This magnetization is manipulated by a RF magnetic field, B1, created using a coil.

As previously noted, downhole NMR application can typically use the CPGM echo train pulse sequence as shown in FIG. 6. CPMG consists of an excitation pulse, commonly used for tipping the magnetization 90°. As the free induction decays quickly in a gradient field, a recovery pulse, commonly but not exclusively a 180° pulse, is used to refocus the magnetization, causing a spin echo. The recovery pulse is repeated several times dependent on the experiment and power limitations of the tool. The CPMG has one "excitation" pulse, followed by several recovery pulses. This pulse generally tips the magnetization 90° into the transverse plane, where it can be detected. As discussed next, this pulse may not be a true 90° pulse, that is, not all of the magnetization will tip 100% into the transverse plane at all locations in the excited zone. Following the excitation pulse is a train of refocusing pulses, typically 180° pulses. The timing between these pulses is known as the inter echo spacing, or echo time (TE). The CPMG is a direct measurement of the transverse magnetization decay ($T_2$). It is used to indirectly measure the longitudinal magnetization buildup ($T_1$) by varying recovery wait time and to measure diffusion by varying inner echo time. The actual NMR measurement takes place between pulses and is known as an "echo."

The theoretical NMR echo signal from a CPMG for a single relaxation time component, is commonly represented by above equation (1):

$$s(t) = \left(1 - e^{-\frac{TW}{T1}}\right) \cdot e^{-\frac{t}{T2}} \cdot e^{-\frac{D(\gamma GTE)^2 t}{12}} \quad (1)$$

where, as previously noted, TW (wait time) is the time allowed for the magnetization to polarization, T1 is the longitudinal recovery time constant, t is the time of the echo peak, $T_2$ is the transverse decay constant, D is the diffusion constant, γ is the gyromagnetic ratio, G is the gradient, TE is the time between echoes. S/V is the surface to volume ratio of the pores and ρ is the surface relaxivity. Typically measured data is compared against equation (1) using different theoretical $T_1$ and $T_2$ to calculate time zero echo amplitude, which discloses total porosity, and to create an inversion spectra with axis of $T_1$, $T_2$, and/or D vs amplitude. However, because equation (1) only captures the stationary signal form, it does not take into account the motion while drilling or pulling.

For LWD tools, the ROP is typically between 30 to 120 ft/hr. This motion has several potential effects on the NMR echo trains to deviate it from the previous equation, which causes the inversion to be incorrect. Within an echo train, there are losses attributed to the formation moving into a new zone while pulsing. In the $T_1$ experiment, there can be overcall or undercall; because of fresh zones after the saturation/inversion pulse, there are prepolarization motion dependent effects caused by magnetic field shape, motion-induced spin-dephase, and additional tipping errors attributed to imperfect $B_1$.

It is well-known that the measurement accuracy of NMR tools decreases while being pulled. For tools with very long antenna aperture, this inaccuracy is small compared to the noise of the downhole tool measurement, and is usually either compensated afterward, or simply ignored. Though the inaccuracy of a long antenna tool is widely accepted the method presented here could still improve data quality. This is especially true for when the tool is ran at high speed.

The smaller antenna-aperture associated with a low-gradient LWD NMR tools is more sensitive to the axial motion. Because the sensitive volume is often not a simple geometry, and the effect of the axial motion is nonlinear to the distance moved, the correction cannot be easily applied in the relaxation time domain accurately. For this reason, a method as taught herein incorporates the speed of axial-motion with the relaxation decay functions in the inversion coefficient matrix.

Figure 21:
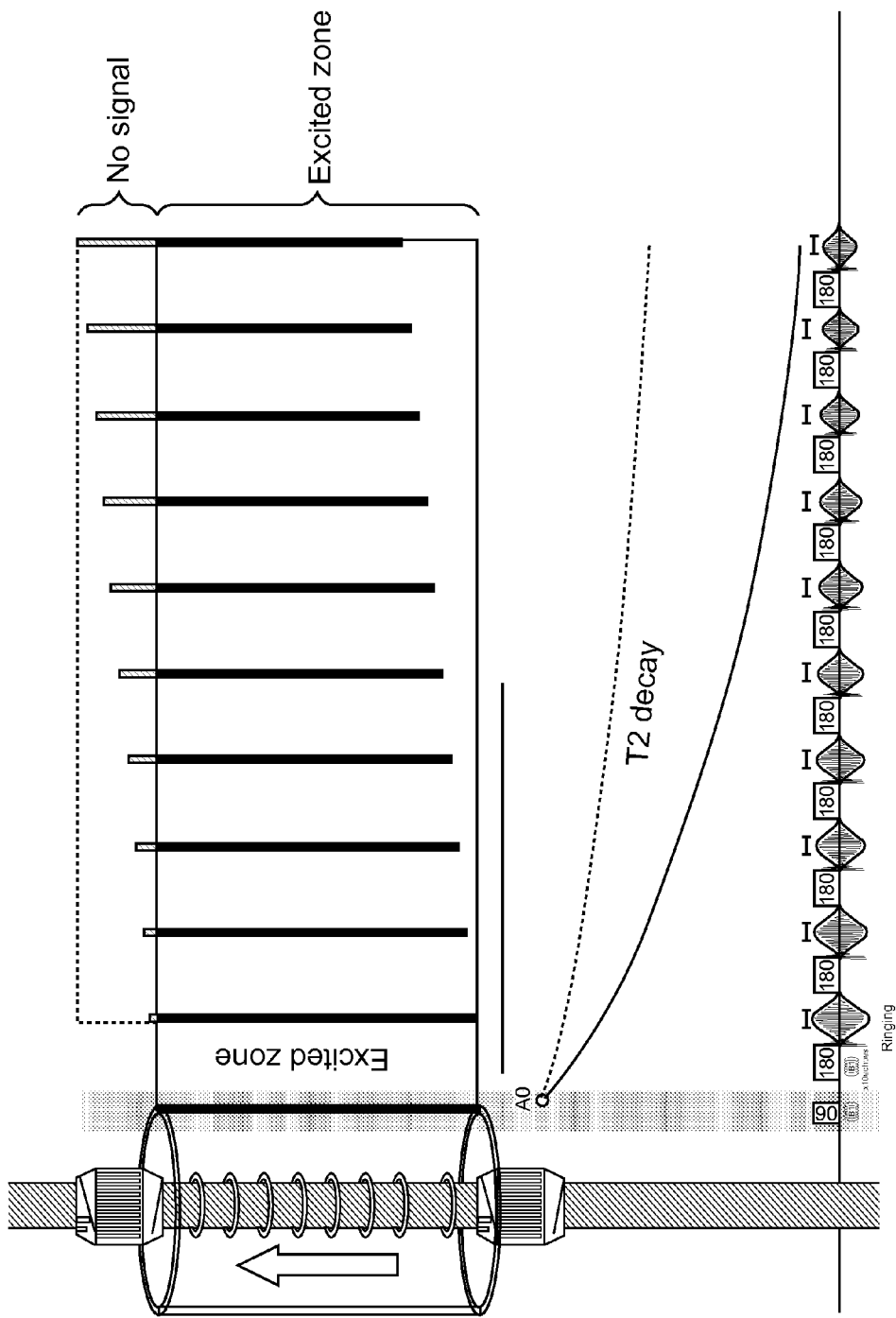
FIG. 21 is a representation of an excited volume, which happens at the time of the excitation pulse.

At the start of the CPGM is a "90°" excitation pulse. The excited volume is the only volume that will provide signal from the refocusing pulses. FIG. 21 is a representation of an excited volume, which happens at the time of the excitation pulse. As the tool moves during the rest of the CPMG the sensitive volume partially moves into a zone with no signal which causes the T2 decay to be lower than in the stationary case. So, as the tool moves, illustrated in FIG. 21, the refocusing pulses are applied on a zone that was not excited by the 90° pulse. This means that the $T_2$ signal is progressively less. During a CPMG echo train, the signal drops faster than expected because of the motion of the tool. This is because the sensitive volume moves away from the original excited zone. This does not cause any error to A0 (maximal signal), but artificially enhances the $T_2$ decay rate.

Figure 22A:
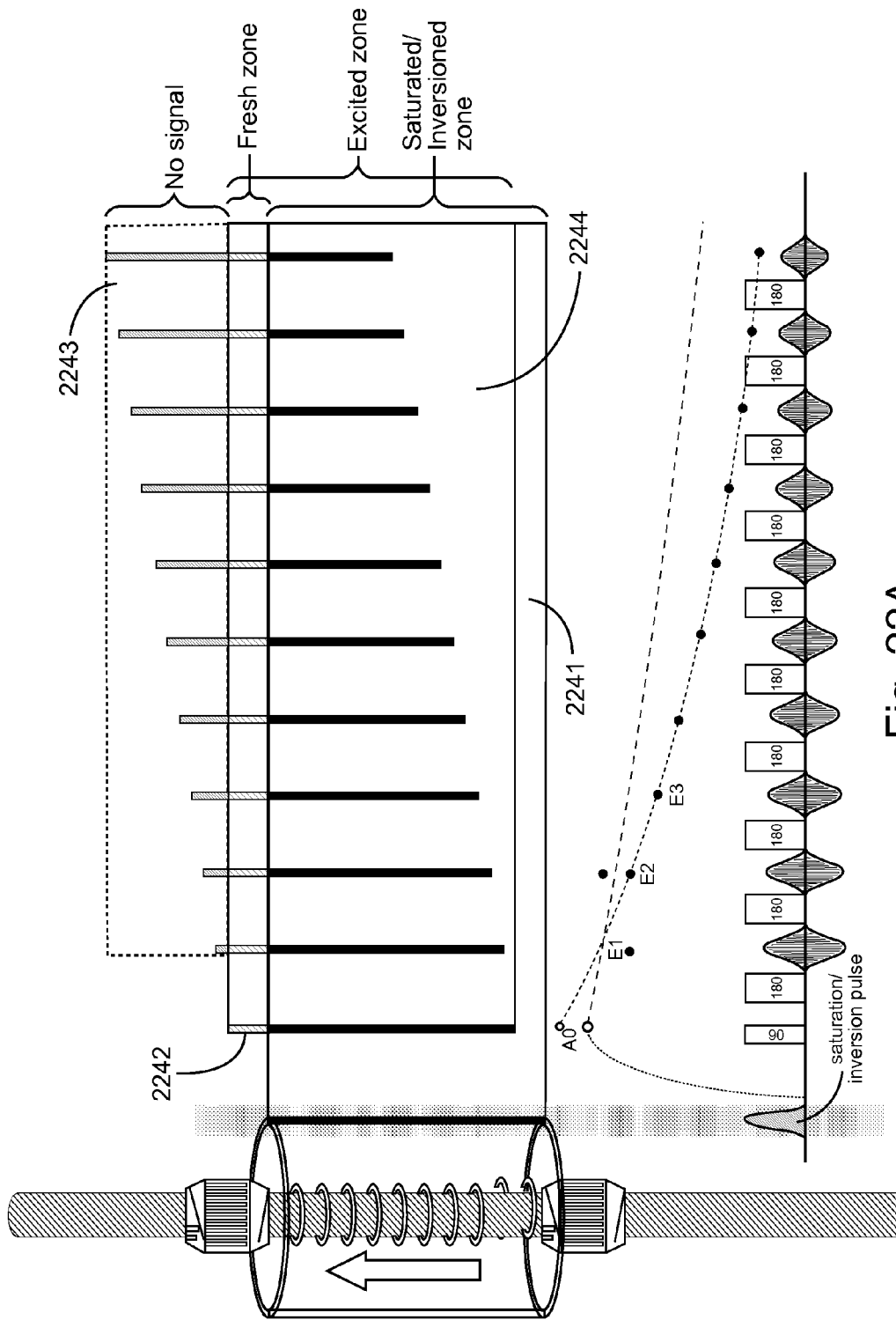
FIG. 22A is a representation of a T1 sequence showing the movement of the sensitive region relative to a nuclear magnetic resonance tool, where the sensitive volume at the excitation pulse is no longer the sensitive volume that had the saturation pulse applied.
Figure 22B:
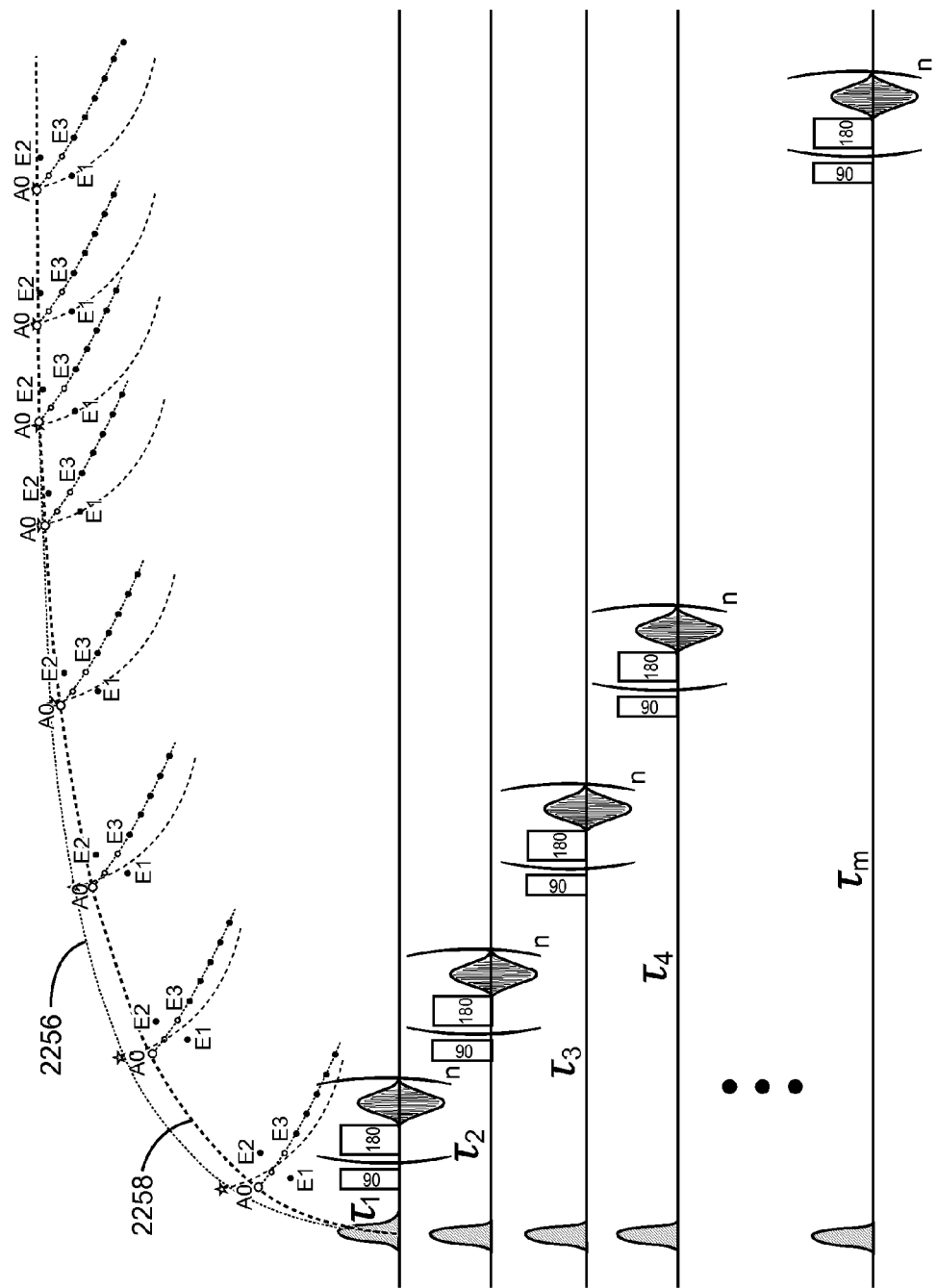
FIG. 22B is a representation of a $T_1$ experiment considering only a fresh zone and no over-polarization effects.

The $T_1$ experiment begins with a saturation pulse. Often, this saturation pulse is a saturation/inversion pulse. This pulse is designed to nullify the magnetization as the initial state for all experiments with different TWs. This could be thought of as scrambling of the magnetization into all orientations. Instead of a saturation pulse, an inversion pulse, which puts the magnetization into the negative direction of $B_0$, could also be used. $T_1$ experiments measure the rate of magnetization buildup in the $B_0$ direction. This measurement is taken using indirect measurement by varying the recovery time (i.e., TW (wait time), following a saturation/inversion pulse. Following the recovery time is a CPMG sequence. The CPMG sequence will suffer the same losses as previously described. During the wait time, the tool moves, and so does the volume of inquiry. When the excitation "90°" pulse is applied, some of the saturated/ inverted zone is no longer in the sensitive volume, but has been replaced with a 100% polarized volume as shown in FIGS. 22A and 22B, which causes the signal to be higher than expected. This distortion primarily effects the medium wait times.

FIG. 22A is a representation of a T1 sequence showing the movement of the sensitive region (excited region) 2244 relative to a nuclear magnetic resonance tool, where the sensitive volume at the excitation pulse is no longer the sensitive volume that had the saturation pulse applied. This causes the echo heights to be higher than in the stationary case. Region 2241 represents a saturated/inversioned region. As the tool moves, during the wait time, some fresh zone 2242 moves into the sensitive region. The zone excited by the excitation pulse (90° pulse) excites both some of the fresh zone 2242 and part of the saturated/inversioned zone 2241. As the CPMG continues, small portions of fresh zone 2242 continue to move into the sensitive volume while the saturated/inversioned zone 2241 moves out. The new zone 2243 during the refocusing pulses does not give signal. FIG. 22B is a cartooned version of a $T_1$ experiment considering only the fresh zone 2242 and no signal effects. Curve 2256 is the actual type signal increase. Curve 2258 is the theoretical equation (1) growth. The $T_2$ train decreases faster than $T_2$ in equation (1) at all wait times. When the wait time is short, there is little time for fresh zone accumulation. At middle wait times, 300 to 12 ms (depending on $T_1$), the fresh zone 2242 and saturated/inversioned zone 2241 will separate the most, and the signal will be higher than the theoretical value in equation (1). At long wait times, 6000 to 18000 ms (depending on $T_1$), the actual and theoretical value from equation (1) have nearly the same prepolarization.

The majority of logging tools have magnets, which yield stronger $B_0$ field preceding the NMR sensitive volume. The magnetization relaxes according to the field strength it detects. For a single T1 component, the magnetization is given by the above equation (2)

$$M(t_{i+1})=M_i+(\chi B_0(r,z)-M_i)\cdot(1-e^{-\Delta t/T1}) \quad (2)$$

It builds up according the field it is currently in and how much magnetization currently exists. Prepolarization is affective on a microscopic level. The micro magnetization, the magnetization at any small spot in the formation, will differ because each spot has a different history. Essentially, it is a pseudo integration of all the magnetic fields it has experienced until the time of interest. This means it could be higher or lower than if it was polarizing in a stationary magnetic field, $M=\chi B_0(1-e^{-\Delta t/T1})$. See FIGS. 23A and 23B.

Figure 23A:
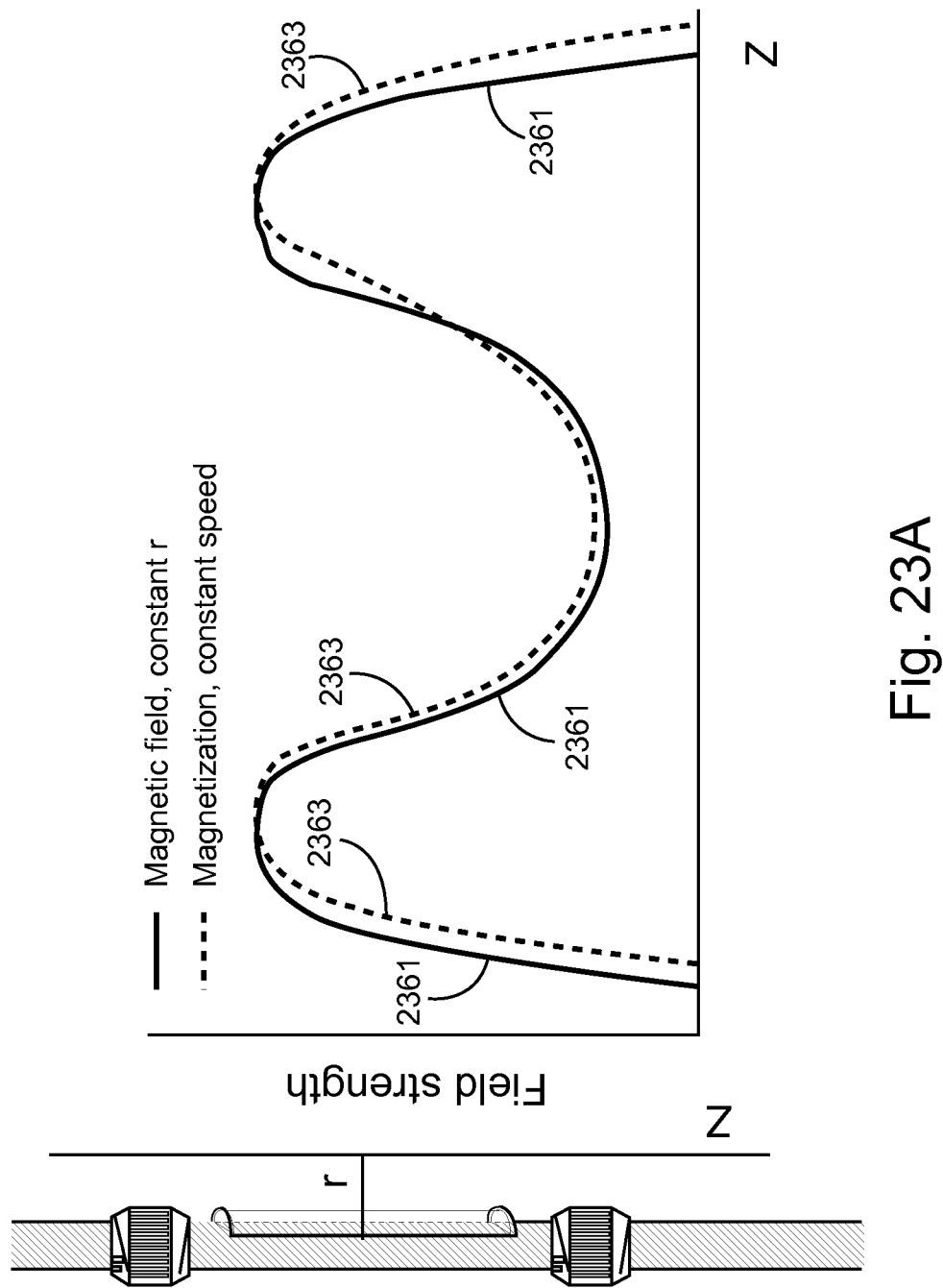
FIG. 23A is a representation of a magnetic field at constant radial distance away from a tool and the magnetization that field creates when moving at a constant speed.
Figure 23B:
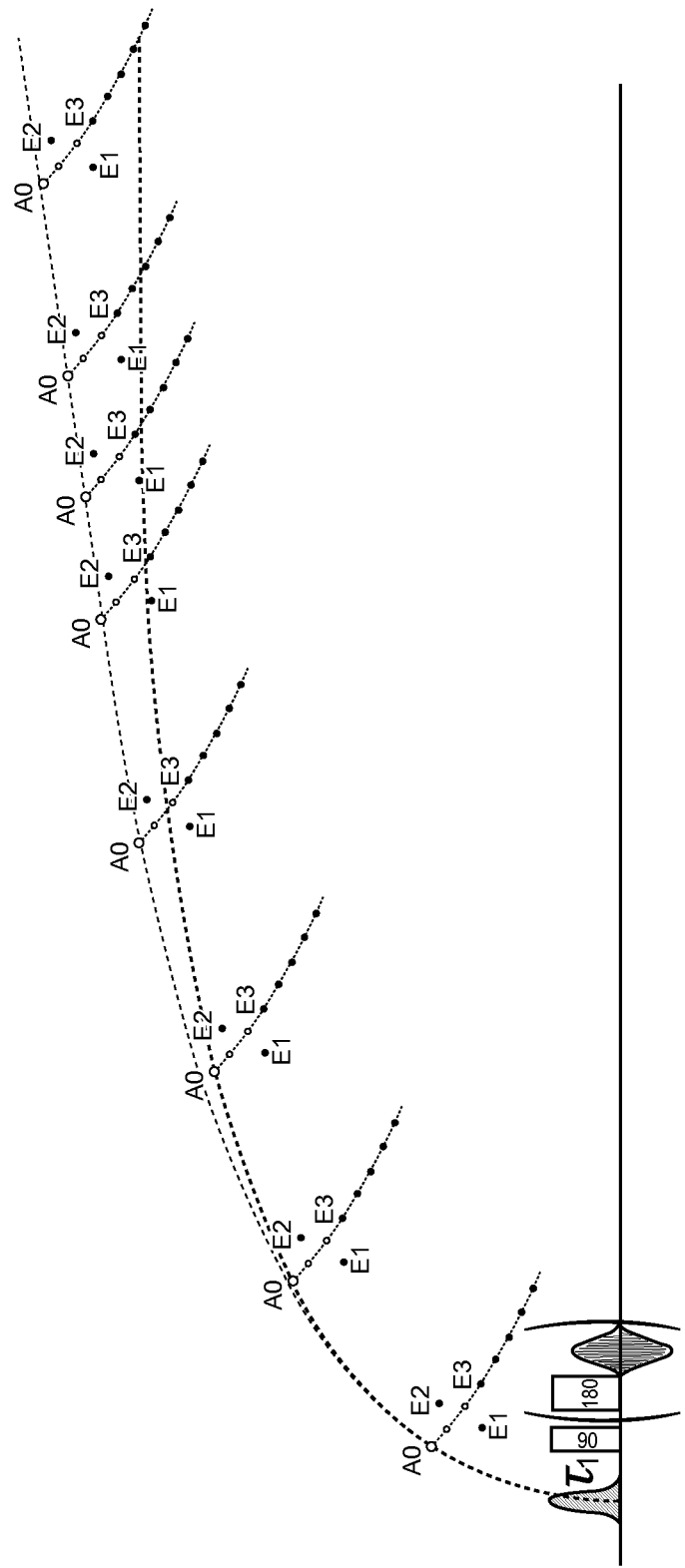
FIG. 23B is a representation of the effects of the magnetization having "memory" known as over polarization.

FIG. 23A is a representation of a curve 2361 showing a magnetic field at constant distance, r, and a curve 2363 showing magnetization at a constant speed. The magnetic field is often stronger preceding the sensitive region. Because that tool is being pulled and micro magnetization has memory, this can cause the overall magnetization to be larger when an experiment begins, rather than if the tool were not moving. Memory in this case is the result of a correct state being the sum of the previous states and interactions.

A diffusion effect created using NMR is caused by the random motion that occurs within the formation. It causes an irreversible decay in the echo train, which is significantly dependent on how fast the magnetization is refocused. This is attributed to different magnetic fields affecting the magnetization as it moves through a gradient. As the tool moves, the magnetization experiences different magnetic field strengths; which is, mathematically similar to diffusion, $$D = \frac{\lambda^2}{2\tau},$$

where $\lambda$ in diffusion is the root mean square distance travelled during the time increment $\tau$. Because the micro magnetization will experience more than one $B_0$ between pulses, the phase of the spins becomes jumbled, just as if it had diffused. FIG. 12 is a representation of additional diffusion in nuclear magnetic resonance measurements due to pulling the tool in the borehole. While the tool is moving, a particular part of the formation will undergo the influence of many different $B_0$s. This happening during an experiment causes an unrecoverable phase. This is similar to the effect of a molecule diffusing through the formation and picking up additional phase because of the influence of different $B_0$s.

With respect to problems with B1 Inhomogeneity, there are inconsistencies in the $B_1$ field. The $B_1$ field naturally falls off in a logging tool as it faces outward. The higher frequencies (determined by $B_0$) tend to be closer to the logging tool, where the $B_1$ is stronger. A pulse excites not only the center frequency, but a bandwidth (BW) around it, $BW=1/\tau_{pulse}$. This means, within the sensitive volume, there will be a spread of tipping angles. As a result, there are additional departures from the echo prediction in equation (1).

With respect to stationary inversion, to interpret the measured echoes, s(t), the data is inverted into different basis, T2, T1, or D. The inversion fits the data to discrete levels of $T_1$s, $T_2$s, or Ds, where the coefficient, $x_{ijk}$, would be the porosity:

$$s(t)=\Sigma_{ijk} x_{ijk} \cdot A(T_{1i},T_{2j},D_k) \quad (20)$$

Here, $A(T_{1i}, T_{2j}, D)$ is a theoretically calculated echo train for a specific $T_2$, $T_1$, and D. Mapping $x_{ijk}$ against $T_1$, $T_2$, or D gives a multidimensional spectrum, while the sum of $x_{ijk}$ is the total porosity.

The drilling tool, discussed herein, focuses on T1 spectra, which is simplified in practice by relating $T_{1i}$ and $T_{2j}$ by a factor and considering only one inner echo time (TE); however, the methods taught herein can be used for any number of dimensions available in the previous equation.

The stationary known form, inexplicitly including the S/V and diffusion term, of its echo trains can be:

$$nthEcho: y^k(j) = \sum_{i=1}^{p} x_i \cdot \left(1 - e^{-\frac{TW_k}{T_{1i}}}\right) \cdot e^{-\frac{j \cdot TE}{T_{1i}/T_2 Ratio}} \quad (21)$$

Here, p is the total number of $T_1$ components, and $x_i$ is the corresponding amplitude. The previous equation can be written as the matrix:

$$\begin{array}{c} TW1\ data \left\{ \begin{array}{c} y^1(1) \\ y^1(2) \\ \cdots \\ y^1(n_1) \end{array} \right. \\ TW1\ data \left\{ \begin{array}{c} y^2(1) \\ y^1(2) \\ \cdots \\ y^2(n_2) \end{array} \right. \\ \cdots \\ TW1\ data \left\{ \begin{array}{c} y^m(1) \\ y^m(2) \\ \cdots \\ y^m(n_m) \end{array} \right. \end{array} = \begin{bmatrix} A^1_{11} & A^1_{21} & A^1_{p1} \\ A^1_{12} & A^1_{22} & A^1_{p1} \\ \cdots & \cdots & \cdots \\ A^1_{1n_1} & A^1_{2n_1} & A^1_{pn_1} \\ A^2_{11} & A^2_{21} & A^2_{p1} \\ A^2_{12} & A^2_{22} & A^2_{p2} \\ \cdots & \cdots & \cdots \\ A^2_{1n_2} & A^2_{2n_2} & A^2_{pn_2} \\ \cdots & \cdots & \cdots \\ A^m_{11} & A^m_{21} & A^m_{p1} \\ A^m_{12} & A^m_{21} & A^m_{p1} \\ \cdots & \cdots & \cdots \\ A^m_{1n_m} & A^m_{2n_m} & A^m_{p2n_m} \end{bmatrix} \begin{bmatrix} x_1 \\ x_2 \\ x_3 \\ \cdots \\ x_p \end{bmatrix} \quad (22)$$

where $$A^k_{ij} = \left(1 - e^{-\frac{TW_k}{T_{1i}}}\right) \cdot e^{-\frac{j \cdot TE}{T_{2i}}}$$

is the jth echo associated with the kth recovery time $TW_k$, j is the echo number, $T_{1i}$, $T_{2i}$ are corresponding $T_1$ and $T_2$ constants, m is the total number of recovery times, and p the total number of $T_1$ components. The previous equation can be shortened using:

$$Y = \begin{bmatrix} y^1(1) \\ y^1(2) \\ \cdots \\ y^1(n_1) \\ y^2(1) \\ y^2(2) \\ \cdots \\ y^2(n_2) \\ \cdots \\ y^m(1) \\ y^m(2) \\ \cdots \\ y^m(n_m) \end{bmatrix}, A = [\vec{A^k_1}\ \vec{A^k_2}\ \cdots\ \vec{A^k_p}], X = \begin{bmatrix} x_1 \\ x_2 \\ x_3 \\ \cdots \\ x_p \end{bmatrix}, \quad (23)$$

and $\vec{A^k_i} = \begin{bmatrix} A^1_{i1} \\ A^1_{i2} \\ \cdots \\ A^1_{in_1} \\ A^1_{i1} \\ A^1_{i2} \\ \cdots \\ A^m_{in_2} \\ \cdots \\ A^m_{i1} \\ A^m_{i1} \\ \cdots \\ A^m_{i2n_m} \end{bmatrix}$ as the column vector.

This gives the simple equation, as noted previously in equation (7-1):

$$Y = AX. \quad (24)$$

Rearranging the terms gives, as noted previously in equation (7-2):

$$X = A^{-1}Y, \quad (25)$$

the porosity spectra of interest.

With respect to motion inversion, when the tool is moving with speed v, a single component echo vector $\vec{A^k_j}$ varies with speed and is denoted as $\vec{A^k_j(v)}$, and corresponding Y becomes Y(v), but X stays unchanged, because X is an intrinsic property of the formation. The motion equivalent equation of Y=AX becomes, as noted previously in equation (8-1):

$$Y(v) = A(v)X \quad (26)$$

with the inversion giving the solution, as noted previously in equation (8-2):

$$X = A(v)^{-1} Y(v). \quad (27)$$

If the inverse of stationary matrix A is used in equation (27), the resulting inversion is incorrect: $X^* = A^{-1}Y(v) = A^{-1}A(v)X$. That is, because A(v) is different from the stationary A, attributed to the aforementioned reasons, $A^{-1}A(v)$ is not equal to unit matrix I. So, X* is not the same as X. In other words, if the stationary matrix A is used with moving data, an error is created. The error is caused by the motion effects described.

The simple description of inversion is only used for illustrating the inversion process. A detailed inversion method used for logging measurements can also include a regularization mechanism to improve the stability of the solution. See, for example, Tannús, A. and Garwood, M., 1997, Adiabatic pulses: NMR in Biomedicine, 10, 423-434; Dunn, K. J., Bergman, D. J., and LaTorraca, G. A., 2002, Nuclear magnetic resonance: petrophysical and logging applications (handbook of geophysical exploration: seismic exploration): Pergamon, Danville, Calif., USA; and Prammer, M., 1996, Efficient processing of NMR echo trains: U.S. Pat. No. 5,517,115.

With the complex shapes of the magnetic field, the correct A(v) does not have a simple analytical form. As shown, constructing A(v) matrix under different speed is the key to removing the motion effect.

In an embodiment, a way of creating A(v) more accurately, as presented herein, can include procedures to simulate the echo train completely mathematically using the knowledge of the $B_0$ and $B_1$. Because this calculation is time-consuming, one set of A(v) has been made using the theoretically perfect $B_0$ and $B_1$, instead of by measuring the field from each real logging tool with a Gauss meter and creating A(v) for each tool.

The magnetic and rf fields can be meshed into small voxels, where each represents an amount of micro magnetization. A finer mesh provides more accurate echo trains, however becomes more and more computationally challenging. The tool's response, emf, from any voxel, as in the gridded space of FIG. 24A, can be calculated using the principle of reciprocity, as outlined in Hoult, D., 2000, The principle of reciprocity in signal strength calculations—A mathematical guide: Concepts of Magnetic Resonance, 12, (4), 173-187. Then, the micro magnetizations are followed through time using the Bloch equation. In this way, different A(v) can be found for different ROPs and T1.

$$A(v,T1,\text{ROP}) \propto \int_{Volume} \text{micro magentization}(t,T1,\text{ROP}) \, dV \quad (28)$$

Figure 24A:
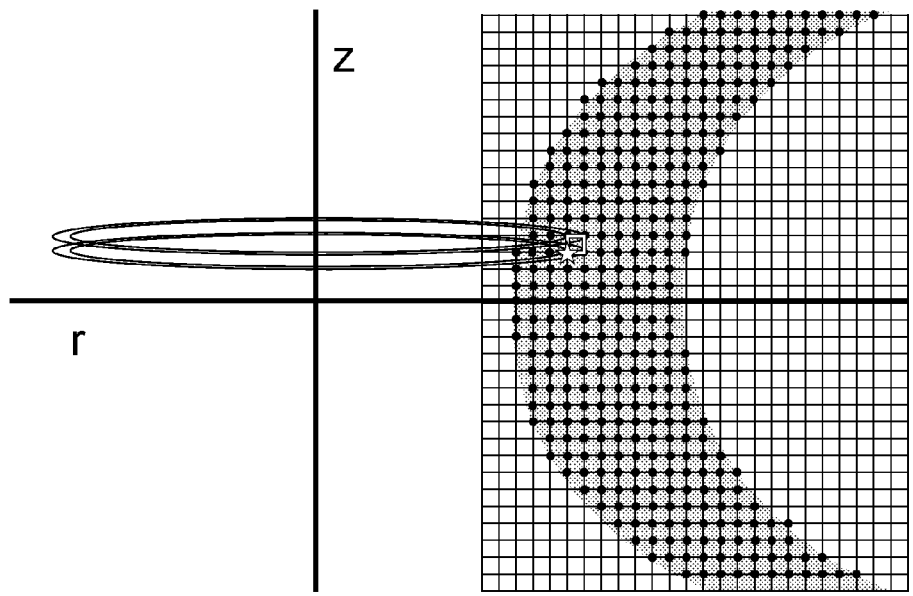
FIG. 24A is a pictorial of a selected sensitive region in a magnetic field.
Figure 24B:
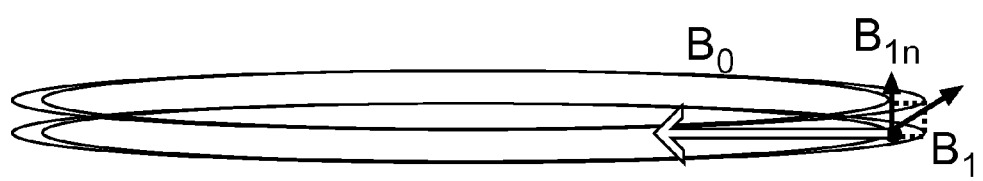
FIG. 24B is a representation of a rotationally symmetric voxel.

FIG. 24A is a pictorial of a selected sensitive region in a magnetic field. This field is split into many voxels. At each voxel, the $B_1$ and the $B_0$ are used to calculate a signal. That signal is then rotated using excitation and refocusing pulses and followed through time to obtain a theoretical echo train. FIG. 24B is a representation of a rotationally symmetric voxel. This allows a simplification in the calculation to go from 3D to 2D using the annulus volume.

In an embodiment, creating the A(v) can be performed using the following steps. First, a zero ROP emf is found just as a calibration would be performed on the tool. This allows to rescale the A(v) into the units of porosity instead of in voltage units. For this calculation, it is simplest to use the tool as a reference frame, that is, as if the tool were stationary and the formation continually moving. In this case, the magnetization field is moved in relation to the $B_0$ and $B_1$ fields at the ROP. The magnetization, M(t), is a function of speed v, $T_2$ decay, $T_1$ recovery time, $B_0$, and $B_1$. A steady state micro magnetization vector is created for each volume with the micro magnetization aligned with $B_0$. The direction of $B_0$ in each voxel can be designated as: $\hat{z}=[0\ 0\ 1]$.

The sensitive volume is then selected from the $B_0$ field using the tool operating frequency. The saturation/inversion pulse is used to null the magnetization in that sensitive volume. Typically, a saturation/inversion pulse can have a bandwidth between ±3 to ±10% of the tool's operating frequency. It generally will be larger than the excitation pulse's bandwidth.

The micro magnetization is then allowed to recover for a total time equaling the wait time. Recovery occurs in small time increments, $\Delta t$, using the following equation:

$$M_{t_{i+1}} = (M_{t_i} + (\chi B_0 - M_{t_i}))(1-e^{-\Delta t/T1})\hat{z}, \quad (29)$$

where M is the micro magnetization to be integrated over, and $\chi$ is the magnetic susceptibility.

The excitation is performed without considering the finite pulse width that is computed as an instantaneous event. The excitation pulse can be done with any phase. The refocusing pulse then is best when it is shifted 90° out of phase from the excitation pulse. For example, the excitation pulse could be along the "x" axis, while the refocusing along the "y." The micro magnetization vector is then rotated using the rotation matrix:

$$R_x(\theta) = \begin{bmatrix} 1 & 0 & 0 \\ 0 & \cos(\theta_{tipE}) & -\sin(\theta_{tipE}) \\ 0 & \sin(\theta_{tipE}) & \cos(\theta_{tipE}) \end{bmatrix} \quad (30)$$

The tipping angle, θ, for each voxel is determined using the strength of $B_1$ perpendicular to $B_0$, $B_{1n}$, at the voxel's location:

$$\theta_{tipE} = \pi \gamma B_{1n} \tau_{excitation} \quad (31)$$

Following the excitation pulse, the micro magnetization is allowed to precess freely around the static field for ½ TE. From the Bloch equation, it is known that magnetization undergoes a precession under the influence of a magnetic field, which can be simply represented as a rotation:

$$R_z(\theta) = \begin{bmatrix} \cos(\theta_{FID}) & -\sin(\theta_{FID}) & 0 \\ \sin(\theta_{FID}) & \cos(\theta_{FID}) & 0 \\ 0 & 0 & 1 \end{bmatrix} \quad (32)$$

During this time, the magnetization is still recovering by means of equation (31). So, the rotation also performed in small time increments, $\theta_{FID} = 2\pi\gamma B_0 \Delta t$, until a total time of ½TE has passed.

During the FID, it is easy to access that magnetization spreads within a couple hundred microsecond to the point where no signal would be measured, making the reason for a recovery pulse obvious.

The first step to recovering the magnetization is to perform a pulse, which will flip the fast and slow spins' phases. Ideally, this would be a 180° pulse; but, as with the excitation pulse, the exact rotation each voxel undergoes will be dependent on the $B_{1n}$.

$$R_y(\theta) = \begin{bmatrix} \cos(\theta_{tipR}) & 0 & \sin(\theta_{tipR}) \\ 0 & 1 & 0 \\ -\sin(\theta_{tipR}) & 0 & \cos(\theta_{tipR}) \end{bmatrix} \quad (33)$$

where $\theta_{tipR} = \pi\gamma B_{1n} \tau_{recovery}$. This calculation is repeated for all of the wait times in the $T_1$ experiment and for $T_1$ spanning a range of time, for example, between 0.01 s and 10 s.

The porosity overcall can be corrected using a more accurate A matrix during inversion processing. The A matrix, A(v), can be constructed for a number of different speeds with different T1s. Although this technique requires long computational time for developing the A(v), it only requires being performed once. For low-gradient logging tools, the method proves to be very accurate. In tests, data generated had an average overcall of 2 PU attributed to the motion effects on a short aperture. Applications of one or more techniques taught herein may also provide real-time application as data is logged at a well site.

Figure 25:
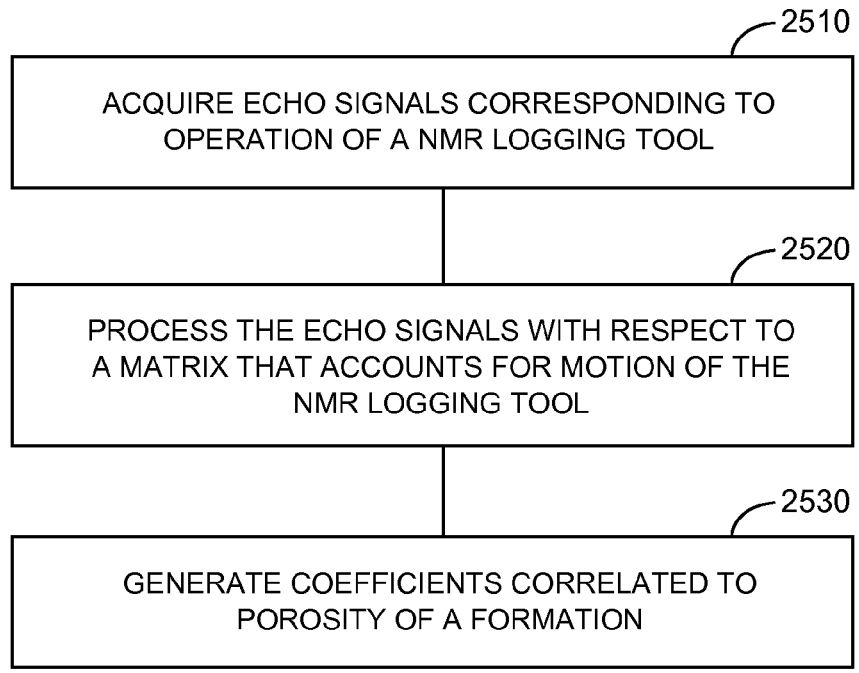
FIG. 25 is a flow diagram of features of an example method to process nuclear magnetic resonance data taking into account motion of the nuclear magnetic resonance logging tool.

FIG. 25 is a flow diagram of features of an example method to process NMR data taking into account motion of the NMR logging tool. At 2510, echo signals are acquired corresponding to operation of a NMR logging tool. The NMR can be disposed downhole in a borehole at a drilling site to evaluate the formation. Theoretical NMR data can be generated within a simulation. At 2520, the echo signals are processed with respect to a matrix that accounts for motion of the nuclear magnetic resonance logging tool. The matrix can also be based on parameters from the operation of the nuclear magnetic resonance tool. At 2530, coefficients correlated to porosity of the formation are generated.

Various features associated with the method corresponding to FIG. 25 can include a number of additional actions or structures. Processing the echo signals can include using a motion dependent matrix constructed under different speeds of the motion of the nuclear magnetic resonance logging tool. The motion dependent matrix can be constructed under a selected number of different speeds of the motion of the nuclear magnetic resonance logging tool augmented with interpolation and/or extrapolation with respect to the different speeds. Processing the echo signals can include using a matrix that accounts for distortions due to $T_2$ signal loss, $T_1$ over call, over polarization, and inhomogeneities of a radio frequency magnetic field $B_1$ of the NMR logging tool. Processing the echo signals can include using a matrix that accounts for motion of the NMR logging tool stored in a memory system. Processing the echo signals can include processing the echo signals with respect to a stationary matrix, the stationary matrix based on parameters from the operation of the nuclear magnetic resonance tool stationary with respect to the formation; and generating the coefficients correlated to porosity of the formation by applying a motion correction matrix to the echo signals processed with respect to the stationary matrix. The motion correction matrix can be realized as the product of an inverse of a motion dependent matrix and the stationary matrix. One of more portions of these features associated with FIG. 25 may be combined to generate additional embodiments to process NMR data taking into account motion of the NMR logging tool.

Figure 26:
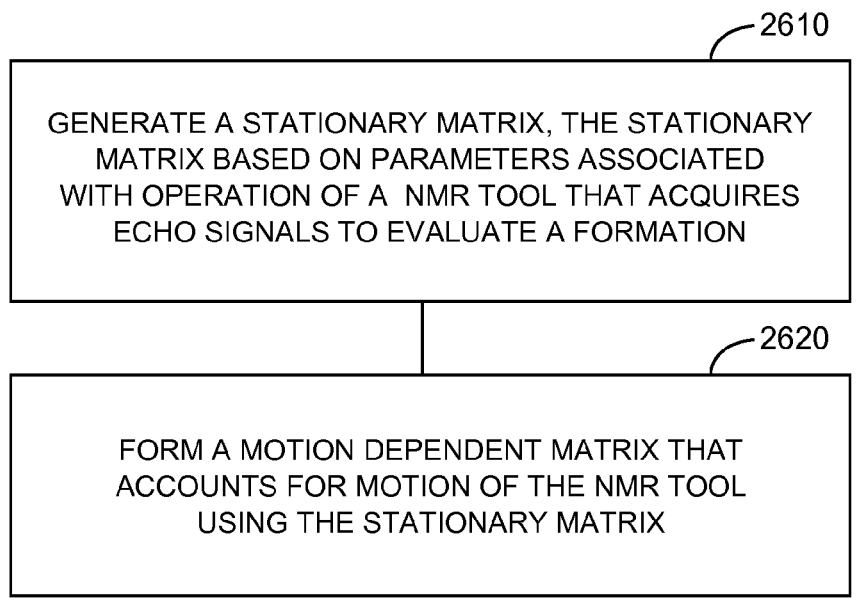
FIG. 26 is a flow diagram of features of an example method to process nuclear magnetic resonance data taking into account motion of a nuclear magnetic resonance logging tool.

FIG. 26 is a flow diagram of features of an example method to process NMR data taking into account motion of the NMR logging tool. At 2610, a stationary matrix is generated, where the stationary matrix is based on parameters associated with operation of a nuclear magnetic resonance tool that acquires echo signals to evaluate a formation. At 2620, a motion dependent matrix is formed that accounts for motion of the nuclear magnetic resonance logging tool using the stationary matrix. The motion dependent matrix can be formed by multiplying each element of the stationary matrix by one or more functions representing effects of motion of the nuclear magnetic resonance tool on the respective element.

Various features associated with the method corresponding to FIG. 26 can include a number of additional actions or structures. The one or more functions can include one or more of a function representing transverse relaxation time ($T_2$) signal losses, a function representing effects of a fresh zone entered by the motion during a wait time, a function representing a diffusion factor, a function representing prepolarization, or a function representing effects of motion relative to a radio frequency magnetic field ($B_1$) of the nuclear magnetic resonance logging tool. The multiplication can be realized by a product of the function representing $T_2$ signal losses, the function representing effects of a fresh zone entered by the motion during a wait time, the function representing a diffusion factor, the function representing prepolarization, and the function representing effects of motion relative to $B_1$. The function representing $T_2$ signal losses can be related to $T_2$, rate of penetration of the motion of the nuclear magnetic resonance logging tool, and the length of volume sensitive to excitation by the nuclear magnetic resonance logging tool; the function representing effects of the fresh zone can be related to longitudinal recovery time ($T_1$), the rate of penetration of the motion of the nuclear magnetic resonance logging tool, the length of volume sensitive to excitation by the nuclear magnetic resonance logging tool, and wait time; the function representing the diffusion factor can be related to the rate of penetration of the motion of the nuclear magnetic resonance logging tool; and the function representing prepolarization can be related to a static magnetic field of the nuclear magnetic resonance logging tool, the static magnetic field being function of speed and time. One of more portions of these features associated with FIG. 26 may be combined to generate additional embodiments to process NMR data taking into account motion of the NMR logging tool.

Figure 27:
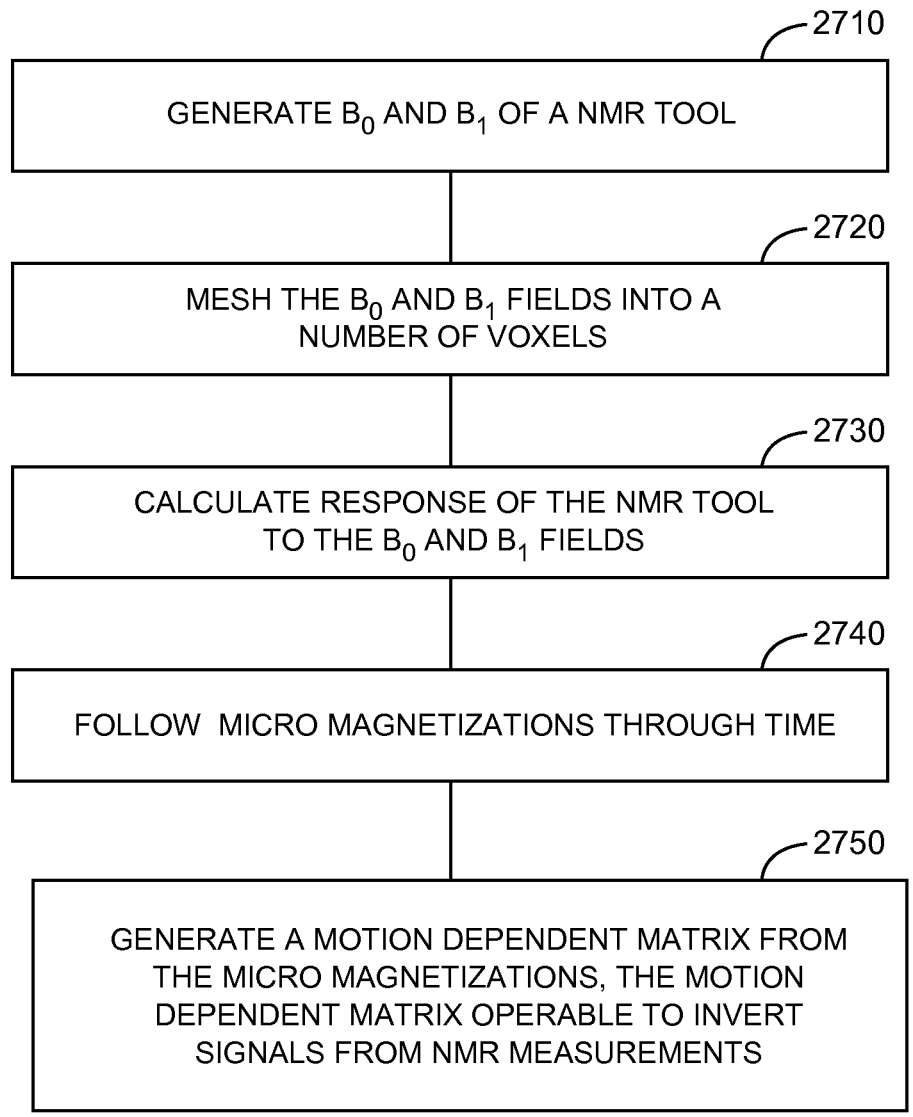
FIG. 27 is a flow diagram of features of an example method to process nuclear magnetic resonance data taking into account motion of a nuclear magnetic resonance logging tool.

FIG. 27 is a flow diagram of features of an example method to process NMR data taking into account motion of the NMR logging tool. At 2710, a $B_0$ and $B_1$ of a NMR tool are generated. At 2720, the $B_0$ and $B_1$ fields are meshed into a number of voxels. At 2730, response of the NMR tool to the $B_0$ and $B_1$ fields are calculated. At 2740, micro magnetizations are followed through time. At 2750, a motion dependent matrix is generated from the micro magnetizations, where the motion dependent matrix is operable to invert signals from nuclear magnetic resonance measurements.

Various features associated with the method corresponding to FIG. 27 can include a number of additional actions or structures. Such additional actions or structures can include, for each waiting time of a plurality of waiting times and for each longitudinal recovery time ($T_1$) of a plurality of $T_1$ times: generating a response of the nuclear magnetic resonance tool for zero rate of penetration; generating a steady state micro magnetization for each voxel aligned with $B_0$; selecting a sensitive volume from the $B_0$ field using an operating frequency of the nuclear magnetic resonance tool and nulling the magnetization in the sensitive volume; generating an excitation pulse; generating a refocusing excitation pulse; rotating a micro magnetization vector using a rotation matrix based on a tipping angle for each voxel based of $B_1$ perpendicular to $B_0$ at the respective voxel location; representing precession of the micro magnetization following the excitation pulse by a rotation matrix based on magnitude of $B_0$ and time increments; and representing recover of magnetization by a rotation matrix based on a tip angle related to $B_1$ perpendicular to $B_0$ at the respective voxel location and recovery time. One of more portions of these features associated with FIG. 27 may be combined to generate additional embodiments to process NMR data taking into account motion of the NMR logging tool.

In various embodiments, features associated with FIGS. 25-27 may be combined to generate a method to process NMR data taking into account motion of the NMR logging tool. In addition, a machine-readable storage device can have instructions stored thereon, which, when performed by a machine, cause the machine to perform operations, the operations comprising a method of associated with any of FIGS. 25-27 or combinations thereof. Further, a machine-readable storage device, herein, is a physical device, which is a non-transitory device, that stores data represented by physical structure within the device. Examples of machine-readable storage devices include, but are not limited to, read only memory (ROM), random access memory (RAM), a magnetic disk storage device, an optical storage device, a flash memory, and other electronic, magnetic, and/or optical memory devices.

In various embodiments, a system comprises a nuclear magnetic resonance tool; a control unit coupled to the nuclear magnetic resonance tool to control the nuclear magnetic resonance tool; and a processing unit arranged with the nuclear magnetic resonance tool and a control unit to perform operations according to a method associated with any of FIGS. 25-27 or combinations thereof. Various components and/or features associated with the system can include a number of additional structures or structures arranged to conduct additional actions. The NMR tool can include a magnet with an average gradient magnet field varying from about 1 gauss/cm to about 60 gauss/cm in a direction of investigation of a sensitive volume.

Figure 28:
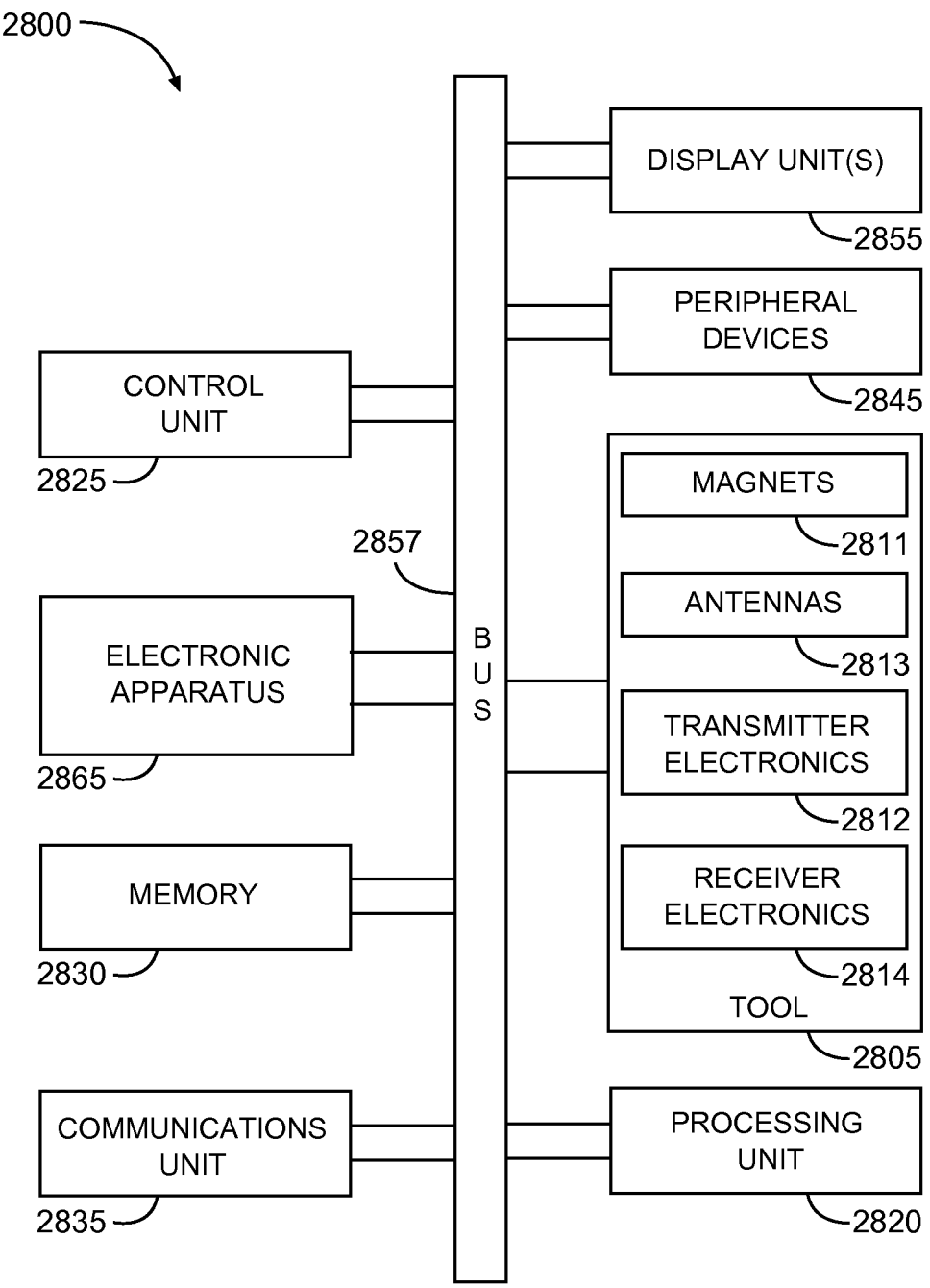
FIG. 28 is a block diagram of features of an example system operable to process nuclear magnetic resonance data taking into account motion of a nuclear magnetic resonance logging tool, in accordance with various embodiments.

FIG. 28 is a block diagram of features of an example embodiment of a system 2800 operable to process nuclear magnetic resonance data taking into account motion of a NMR logging tool 2805, as described herein or in a similar manner. The system 2800 can include a NMR tool 2805 having an arrangement of magnets 2811, antenna(s) 2813, transmitter electronics 2812, and receiver electronics 2814. The system 2800 can be configured to operate in accordance with the teachings herein.

The system 2800 can include a control unit 2825, a memory 2830, an electronic apparatus 2865, and a communications unit 2835. The memory 2830 can be structured to include a database. The control unit 2825, the memory 2830, and the communications unit 2835 can be arranged to operate as a processing unit to control operation of the transmitter electronics 2812 and the receiver electronics 2814 and to perform operations on the signals collected by the receiver electronics 2814 to process nuclear magnetic resonance data taking into account motion of a NMR logging tool 2805. A processing unit 2820, structured to process nuclear magnetic resonance data taking into account motion of a NMR logging tool 2805, can be implemented as a single unit or distributed among the components of the system 2800 including electronic apparatus 2865. The control unit 2825 and the memory 2830 can operate to control activation of the transmitter electronics 2812 to generate echo train sequences and recovery pulses. The control unit 2825 and the memory 2830 can operate to control selection of the receiver electronics 2814 in the tool 2805 and to manage processing schemes. The control unit 2825, the memory 2830, and other components of the system 2800 can be structured, for example, to operate similar to or identical to the components discussed herein or similar to or identical to any of methods discussed herein.

The system 2800 can also include a bus 2857, where the bus 2857 provides electrical conductivity among the components of the system 2800. The bus 2857 can include an address bus, a data bus, and a control bus, each independently configured or in an integrated format. The bus 2857 can be realized using a number of different communication mediums that allows for the distribution of components of the system 2800. Use of the bus 2857 can be regulated by the control unit 2825. Bus 2857 can include a communications network.

In various embodiments, the peripheral devices 2845 can include additional storage memory and other control devices that may operate in conjunction with the control unit 2825 and the memory 2830. In an embodiment, the control unit 2825 can be realized as a processor or a group of processors that may operate independently depending on an assigned function. The system 2800 can include display unit(s) 2855, which can be used with instructions stored in the memory 2830 to implement a user interface to monitor the operation of the tool 2805 or components distributed within the system 2800.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. A method comprising:
   acquiring echo signals from operation of a nuclear magnetic resonance logging tool to evaluate a formation;
   processing, using a processor, the echo signals to determine one or more coefficients correlated to one or more porosities of the formation through inversion utilizing a matrix, wherein at least one element of the matrix is based on a motion of the nuclear magnetic resonance logging tool, and wherein at least one element of the matrix is based on a parameter from the operation of the nuclear magnetic resonance logging tool; and
   determining a formation property based on the one or more coefficients correlated to the one or more porosities of the formation.

2. A method comprising:
   generating a stationary matrix, wherein the stationary matrix is based on parameters from operation of a nuclear magnetic resonance logging tool that acquires echo signals to evaluate a formation;
   forming a motion dependent matrix that accounts for motion of the nuclear magnetic resonance logging tool by multiplying each element of the stationary matrix by one or more functions representing effects of motion of the nuclear magnetic resonance logging tool on the respective element;
   processing, using a processor, the echo signals through inversion utilizing using the motion dependent matrix to determine one or more coefficients correlated to one or more porosities of the formation; and
   determining a formation property based on the one or more coefficients correlated to the one or more porosities of the formation.

3. A method comprising:
   generating a static magnetic field ($B_0$) and radio frequency magnetic field ($B_1$) of a nuclear magnetic resonance logging tool;
   meshing the $B_0$ and $B_1$ fields into a number of voxels;
   calculating a response of the nuclear magnetic resonance logging tool utilizing the $B_0$ and $B_1$ fields;
   following a set of micro magnetizations through time;
   generating a motion dependent matrix from summing the set of micro magnetizations;
   processing, using a processor, echo signals obtained from the nuclear magnetic resonance logging tool through inversion utilizing the motion dependent matrix to determine one or more coefficients correlated to one or more porosities of a formation; and
   determining a formation property based on the one or more coefficients correlated to the one or more porosities of the formation.

4. A non-transitory machine-readable storage device having instructions stored thereon, which, when performed by a machine, cause the machine to perform operations, the operations comprising:
   acquiring echo signals from operation of a nuclear magnetic resonance logging tool to evaluate a formation;
   processing, using a processor, the echo signals to determine one or more coefficients correlated to one or more porosities of the formation through inversion utilizing a matrix, wherein at least one element of the matrix is based on a motion of the nuclear magnetic resonance logging tool, and wherein at least one element of the matrix is based on a parameter from the operation of the nuclear magnetic resonance logging tool.

5. A system comprising:
a nuclear magnetic resonance logging tool;
a processor; and
a machine-readable storage medium with instructions stored thereon, the instructions executable by the processor to cause the system to:
  acquire echo signals from operation of the nuclear magnetic resonance logging tool to evaluate a formation;
  process the echo signals to determine one or more coefficients correlated to one or more porosities of the formation through inversion utilizing a matrix, wherein at least one element of the matrix is based on a motion of the nuclear magnetic resonance logging tool, and wherein at least one element of the matrix is based on a parameter from the operation of the nuclear magnetic resonance logging tool.

6. A system comprising:
a nuclear magnetic resonance logging tool
a processor; and
a machine-readable storage medium with instructions stored thereon, the instructions executable by the processor to cause the system to:
  generate a stationary matrix, the stationary matrix based on parameters associated with operation of the nuclear magnetic resonance logging tool that acquires echo signals to evaluate a formation;
  form a motion dependent matrix that accounts for motion of the nuclear magnetic resonance logging tool by multiplying each element of the stationary matrix by one or more functions representing effects of motion of the nuclear magnetic resonance logging tool on the respective element; and
  process the echo signals through inversion utilizing the motion dependent matrix.

7. A system comprising:
a nuclear magnetic resonance logging tool;
a processor; and
a machine-readable storage medium with instructions stored thereon, the instructions executable by the processor to cause the system to:
  generate a static magnetic field ($B_0$) and radio frequency magnetic field ($B_1$) of the nuclear magnetic resonance logging tool;
  mesh the $B_0$ and $B_1$ fields into a number of voxels, each voxel representing a micro magnetization of a set of micro magnetizations;
  calculate response of the nuclear magnetic resonance logging tool to the $B_0$ and $B_1$ fields;
  follow the set of micro magnetizations through time; and
  generate a motion dependent matrix from the set of micro magnetizations; and
  process echo signals obtained from the nuclear magnetic resonance logging tool through inversion utilizing the motion dependent matrix.

8. The method of claim 1, wherein processing the echo signals comprises using a motion dependent matrix constructed under different speeds of the motion of the nuclear magnetic resonance logging tool.

9. The method of claim 1, wherein at least one element of the matrix is based on a distortion, wherein the distortion is due to at least one of a transverse relaxation time (T2) signal loss, a longitudinal recovery time ($T_1$) over call, an over polarization, and inhomogeneities of a radio frequency magnetic field ($B_1$) of the nuclear magnetic resonance logging tool.

10. The method of claim 1, wherein the matrix is stored in a memory system.

11. The method of claim 1, wherein processing the echo signals comprises:
  processing the echo signals with respect to a stationary matrix, the stationary matrix based on parameters from the operation of the nuclear magnetic resonance logging tool while the nuclear magnetic resonance logging tool is stationary with respect to the formation; and
  determining the one or more coefficients correlated to the one or more porosities of the formation by applying a motion correction matrix to the echo signals processed with respect to the stationary matrix.

12. The method of claim 11, wherein the motion correction matrix is a product of an inverse of a motion dependent matrix and the stationary matrix.

13. The method of claim 1, wherein at least one element of the matrix is based on a radio frequency magnetic field ($B_1$), a static field ($B_0$), and a running speed of the nuclear magnetic resonance logging tool.

14. The method of claim 1, further comprising storing, in a non-transitory machine-readable medium, the formation property.

15. The method of claim 2, wherein the one or more functions include one or more of a function representing transverse relaxation time (T2) signal losses, a function representing effects of a fresh zone entered by the motion during a wait time, a function representing a diffusion factor, a function representing prepolarization, or a function representing effects of motion relative to a radio frequency magnetic field ($B_1$) of the nuclear magnetic resonance logging tool.

16. The method of claim 15, wherein the multiplication is by a product of the function representing T2 signal losses, the function representing effects of the fresh zone entered by the motion during the wait time, the function representing the diffusion factor, the function representing prepolarization, and the function representing effects of motion relative to $B_1$.

17. The method of claim 15, wherein the function representing T2 signal losses is related to T2, rate of penetration of the motion of the nuclear magnetic resonance logging tool, and a length of volume sensitive to excitation by the nuclear magnetic resonance logging tool; the function representing effects of the fresh zone is related to longitudinal recovery time ($T_1$), the rate of penetration of the motion of the nuclear magnetic resonance logging tool, the length of volume sensitive to excitation by the nuclear magnetic resonance logging tool, and wait time; the function representing the diffusion factor is related to the rate of penetration of the motion of the nuclear magnetic resonance logging tool; and the function representing prepolarization is related to a static magnetic field of the nuclear magnetic resonance logging tool, the static magnetic field being function of speed and time.

18. The method of claim 2, wherein at least one element of the motion dependent matrix is based on a radio frequency magnetic field ($B_1$), a static field ($B_0$), and a running speed of the nuclear magnetic resonance logging tool.

19. The method of claim 2, further comprising storing, in a non-transitory machine-readable medium, the formation property.

20. The method of claim 3, wherein the method comprises, for each waiting time of a plurality of waiting times and for each longitudinal recovery time ($T_1$) of a plurality of $T_1$ times:
   generating the response of the nuclear magnetic resonance logging tool for zero rate of penetration;
   generating a steady state micro magnetization for each voxel aligned with $B_0$;
   selecting a sensitive volume from the $B_0$ field using an operating frequency of the nuclear magnetic resonance logging tool and nulling a magnetization in the sensitive volume;
   generating an excitation pulse;
   generating a refocusing excitation pulse;
   rotating a micro magnetization vector using a rotation matrix based on a tipping angle for each voxel based of $B_1$ perpendicular to $B_0$ at a respective voxel location of the voxel;
   representing precession of the micro magnetization following the excitation pulse by a rotation matrix based on magnitude of $B_0$ and time increments; and
   representing recovery of magnetization by a rotation matrix based on a tip angle related to $B_1$ perpendicular to $B_0$ at the respective voxel location and recovery time.

21. The method of claim 3, wherein the motion dependent matrix is based on a running speed of the nuclear magnetic resonance logging tool.

22. The method of claim 3, further comprising storing, in a non-transitory machine-readable medium, the formation property.

23. The system of claim 5, wherein the nuclear magnetic resonance logging tool has a magnet with an average gradient magnet field varying from about 1 gauss/cm to about 60 gauss/cm in a direction of investigation of a sensitive volume.

24. The system of claim 5, wherein the instructions to process the echo signals comprise use of a motion dependent matrix constructed under different speeds of the motion of the nuclear magnetic resonance logging tool.

25. The system of claim 5, wherein the instructions to process the echo signals include use of a matrix that accounts for distortions due to transverse relaxation time (T2) signal loss, longitudinal recovery time ($T_1$) over call, over polarization, and inhomogeneities of a radio frequency magnetic field ($B_1$) of the nuclear magnetic resonance logging tool.

26. The system of claim 5, wherein the matrix is stored in a memory.

27. The system of claim 5, wherein the instructions to process the echo signals include operations to:
   process the echo signals with respect to a stationary matrix, the stationary matrix based on parameters from the operation of the nuclear magnetic resonance logging tool while the nuclear magnetic resonance logging tool is stationary with respect to the formation; and
   determine the one or more coefficients correlated to the one or more porosities of the formation by application of a motion correction matrix to the echo signals processed with respect to the stationary matrix.

28. The system of claim 27, wherein the motion correction matrix is a product of an inverse of a motion dependent matrix and the stationary matrix.

29. The system of claim 6, wherein the one or more functions include one or more of a function representing transverse relaxation time (T2) signal losses, a function representing effects of a fresh zone entered by the motion during a wait time, a function representing a diffusion factor, a function representing prepolarization, or a function representing effects of motion relative to a radio frequency magnetic field ($B_1$) of the nuclear magnetic resonance logging tool.

30. The system of claim 29, wherein the multiplication is by a product of the function representing T2 signal losses, the function representing effects of the fresh zone entered by the motion during the wait time, the function representing the diffusion factor, the function representing prepolarization, and the function representing the effects of motion relative to $B_1$.

31. The system of claim 29, wherein the function representing T2 signal losses is related to T2, rate of penetration of the motion of the nuclear magnetic resonance logging tool, and a length of volume sensitive to excitation by the nuclear magnetic resonance logging tool; the function representing effects of the fresh zone is related to longitudinal recovery time ($T_1$), the rate of penetration of the motion of the nuclear magnetic resonance logging tool, the length of volume sensitive to excitation by the nuclear magnetic resonance logging tool, and wait time; the function representing the diffusion factor is related to the rate of penetration of the motion of the nuclear magnetic resonance logging tool; and the function representing prepolarization is related to a static magnetic field of the nuclear magnetic resonance logging tool, the static magnetic field being function of speed and time.

32. The system of claim 7, wherein the instructions include, for each waiting time of a plurality of waiting times and for each longitudinal recovery time ($T_1$) of a plurality of $T_1$ times, instructions to:
   generate a response of the nuclear magnetic resonance logging tool for zero rate of penetration;
   generate a steady state micro magnetization for each voxel aligned with $B_0$;
   select a sensitive volume from the $B_0$ field using an operating frequency of the nuclear magnetic resonance logging tool and nulling a magnetization in the sensitive volume;
   generate an excitation pulse;
   generate a refocusing excitation pulse;
   rotate a micro magnetization vector using a rotation matrix based on a tipping angle for each voxel based of $B_1$ perpendicular to $B_0$ at a respective voxel location;
   represent precession of the micro magnetization following the excitation pulse by a rotation matrix based on magnitude of $B_0$ and time increments; and
   represent recovery of magnetization by a rotation matrix based on a tip angle related to $B_1$ perpendicular to $B_0$ at the respective voxel location and recovery time.

* * * * *